US010712408B2

(12) United States Patent
Pham et al.

(10) Patent No.: US 10,712,408 B2
(45) Date of Patent: Jul. 14, 2020

(54) METHODS AND APPARATUS FOR OPTICALLY DETECTING MAGNETIC RESONANCE

(71) Applicant: Massachusetts Institute of Technology, Cambridge, MA (US)

(72) Inventors: Linh M. Pham, Arlington, MA (US); Carson Arthur Teale, Cambridge, MA (US); Hannah A. Clevenson, Cambridge, MA (US); Kerry Alexander Johnson, Somerville, MA (US); Christopher Michael McNally, Cambridge, MA (US); John Francis Barry, Cambridge, MA (US); Danielle Ann Braje, Winchester, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 301 days.

(21) Appl. No.: 15/807,269

(22) Filed: Nov. 8, 2017

(65) Prior Publication Data
US 2018/0136291 A1 May 17, 2018

Related U.S. Application Data

(60) Provisional application No. 62/418,888, filed on Nov. 8, 2016.

(51) Int. Cl.
*G01R 33/26* (2006.01)
*G01R 33/24* (2006.01)
(Continued)

(52) U.S. Cl.
CPC ............ *G01R 33/26* (2013.01); *G01N 24/10* (2013.01); *G01N 24/12* (2013.01); *G01R 33/24* (2013.01); *G01R 33/323* (2013.01)

(58) Field of Classification Search
CPC ........ G01R 33/00; G01R 33/20; G01R 33/24; G01R 33/26; G01R 33/28; G01R 33/32;
(Continued)

(56) References Cited

U.S. PATENT DOCUMENTS 7,544,269 B2 * 6/2009 Strang ................... G01B 15/02
118/723 MW
7,778,296 B1 8/2010 Vuckovic et al.
(Continued)

FOREIGN PATENT DOCUMENTS

WO   WO 2009/073740 A2   6/2009
WO   WO 2012/118944 A2   9/2012
(Continued)

OTHER PUBLICATIONS

Acosta, V. M. et al., "Electromagnetically Induced Transparency in a Diamond Spin Ensemble Enables All-Optical Electromagnetic Field Sensing," Physical Review Letters, vol. 110, May 24, 2013, pp. 213605-1-6.
(Continued)

Primary Examiner — Hoai-an D. Nguyen
(74) Attorney, Agent, or Firm — Smith Baluch LLP

(57) ABSTRACT

A magnetometer containing a crystal sensor with solid-state defects senses the magnitude and direction of a magnetic field. The solid-state defects in the crystal sensor absorb microwave and optical energy to transition between several energy states while emitting light intensity indicative of their spin states. The magnetic field alters the spin-state transitions of the solid-state defects by amounts depending on the solid-state defects' orientations with respect to the magnetic field. The optical read out, reporting the spin state of an ensemble of solid-state defects from one particular orientation class, can be used to lock microwave signals to the resonances associated with the spin-state transitions. The
(Continued)

frequencies of the locked microwave signals can be used to reconstruct the magnetic field vector.

24 Claims, 18 Drawing Sheets

(51) Int. Cl.
*G01N 24/10* (2006.01)
*G01N 24/12* (2006.01)
*G01R 33/32* (2006.01)

(58) Field of Classification Search
CPC ...... G01R 33/323; G01N 24/00; G01N 24/10; G01N 24/12
USPC ....... 324/300, 301, 304, 305, 307, 309, 310, 324/311, 312, 313
See application file for complete search history.

(56) References Cited

U.S. PATENT DOCUMENTS

| | | | |
|---|---|---|---|
| 8,138,756 | B2 | 3/2012 | Barclay et al. |
| 9,551,763 | B1* | 1/2017 | Hahn ................. G01R 33/0017 |
| 9,766,181 | B2 | 9/2017 | Englund et al. |
| 10,088,336 | B2* | 10/2018 | Fisk ...................... G01R 33/032 |
| 2010/0308813 | A1 | 12/2010 | Lukin et al. |
| 2010/0321117 | A1* | 12/2010 | Gan ........................ G04F 5/145 331/3 |
| 2012/0019242 | A1 | 1/2012 | Hollenberg et al. |
| 2013/0334170 | A1 | 12/2013 | Englund et al. |
| 2014/0072008 | A1 | 3/2014 | Englund et al. |
| 2014/0094372 | A1 | 4/2014 | Englund et al. |
| 2014/0166904 | A1 | 6/2014 | Walsworth et al. |
| 2014/0191139 | A1 | 7/2014 | Englund et al. |
| 2015/0001422 | A1 | 1/2015 | Englund et al. |
| 2015/0137793 | A1 | 5/2015 | Englund et al. |
| 2015/0192532 | A1 | 7/2015 | Clevenson et al. |
| 2017/0038411 | A1* | 2/2017 | Yacobi ................... G01Q 60/52 |
| 2017/0322244 | A1* | 11/2017 | Chipaux .............. G01R 23/163 |
| 2017/0338829 | A1* | 11/2017 | Lu ............................ H03B 5/00 |
| 2017/0370979 | A1* | 12/2017 | Braje ................... G01R 33/323 |

FOREIGN PATENT DOCUMENTS

| | | |
|---|---|---|
| WO | WO 2013/040446 A1 | 3/2013 |
| WO | WO 2013/066446 A1 | 5/2013 |
| WO | WO 2013/188651 A1 | 12/2013 |
| WO | WO 2013/188732 A1 | 12/2013 |
| WO | WO 2014/099072 A1 | 6/2014 |
| WO | WO 2015/175047 A2 | 11/2015 |
| WO | WO 2016/118791 A1 | 7/2016 |

OTHER PUBLICATIONS

Acosta, V. M. et al., "Temperature Dependence of the Nitrogen-Vacancy Magnetic Resonance in Diamond," Physical Review Letters, vol. 104, Feb. 19, 2010, pp. 070801-1-4.

Aharonovich, I. et al., "Diamond photonics," Nature Photonics, vol. 5, Jul. 2011, pp. 397-405.

Arroyo-Camejo, S. et al., "Stimulated Emission Depletion Microscopy Resolves Individual Nitrogen Vacancy Centers in Diamond Nanocrystals," vol. 7, No. 12, Nov. 18, 2013, pp. 10912-10919.

Bar-Gill, N. et al., "Solid-state electronic spin coherence time approaching one second," Nature Communications, vol. 4, No. 1743, Apr. 23, 2013, pp. 1-6.

Bar-Gill, N. et al., "Suppression of spin-bath dynamics for improved coherence of multi-spin-qubit systems," Nature Communications, vol. 3, No. 858, May 22, 2012, pp. 1-6.

Bartels, B. et al. "Smooth, optimal control with Floquet theory," arXiv preprint arXiv: 1205.5142, vol. 2 [quant-ph], Sep. 3, 2013, pp. 1-4.

Chen, E. H. et al., "Wide-Field Multispectral Super-Resolution Imaging Using Spin-Dependent Fluorescence in Nanodiamonds." Nano Letters, vol. 13, Apr. 2, 2013, pp. 2073-2077.

Degen, C. L., "Scanning magnetic field microscope with a diamond single-spin sensor," Appl. Phys. Lett. 92, 243111, Sep. 28, 2008. Retrieved from the Internet on Dec. 19, 2017 from <URL: https://arxiv.org.pdf/0805.1215, 4 pages.

Doherty, M. W. et al., "Electronic Properties and Metrology Applications of the Diamond NV$^-$ Center under Pressure," Physical Review Letters, vol. 112, Jan. 31, 2014, pp. 047601-1-5.

Doherty, M. W. et al., "Theory of the ground-state spin of the NV$^-$ center in diamond," Physical Review B, vol. 85, May 3, 2012, pp. 205203-1-5.

Dolde, F. et al., "Electric-field sensing using single diamond spins," Nature Physics, vol. 7, Apr. 17, 2011, pp. 459-463.

Dolde, F., "The nitrogen vacancy center in internal and external fields," Dissertation, Physikaliches Institut der Universität Stuttgart, Jul. 18, 2014, 170 pages.

Hegyi, A. et al., "Nanodiamond imaging: molecular imaging with optically-detected spin resonance of nitrogen-vacancy centers in nanodiamonds," Advances in Photonics of Quantum Computing, Memory, and Communication VI, Proc. of SPIE, vol. 8635, Apr. 1, 2013, pp. 863506-1-863506-8.

Hodges, J. S. et al., "Timekeeping with electron spin states in diamond," Physical Review A, vol. 87, Mar. 28, 2013, pp. 032118-1-032118-11.

Horowitz, V. R. et al., "Electron spin resonance of nitrogen-vacancy centers in optically trapped nanodiamonds," arXiv:1206.1573v1, Jun. 7, 2012, 29 pages.

Igarashi, R. et al., "Real-Time Background-Free Selective Imaging of Fluorescent Nanodiamonds in Vivo," Nano Letters, vol. 12, Oct. 15, 2012, pp. 5726-5732.

International Search Report and Written Opinion dated Nov. 7, 2014 for International Application No. PCT/US14/44618, 11 pages.

International Search Report and Written Opinion dated Jan. 17, 2018 for International Application No. PCT/US2017/060582, 10 pages.

\* cited by examiner

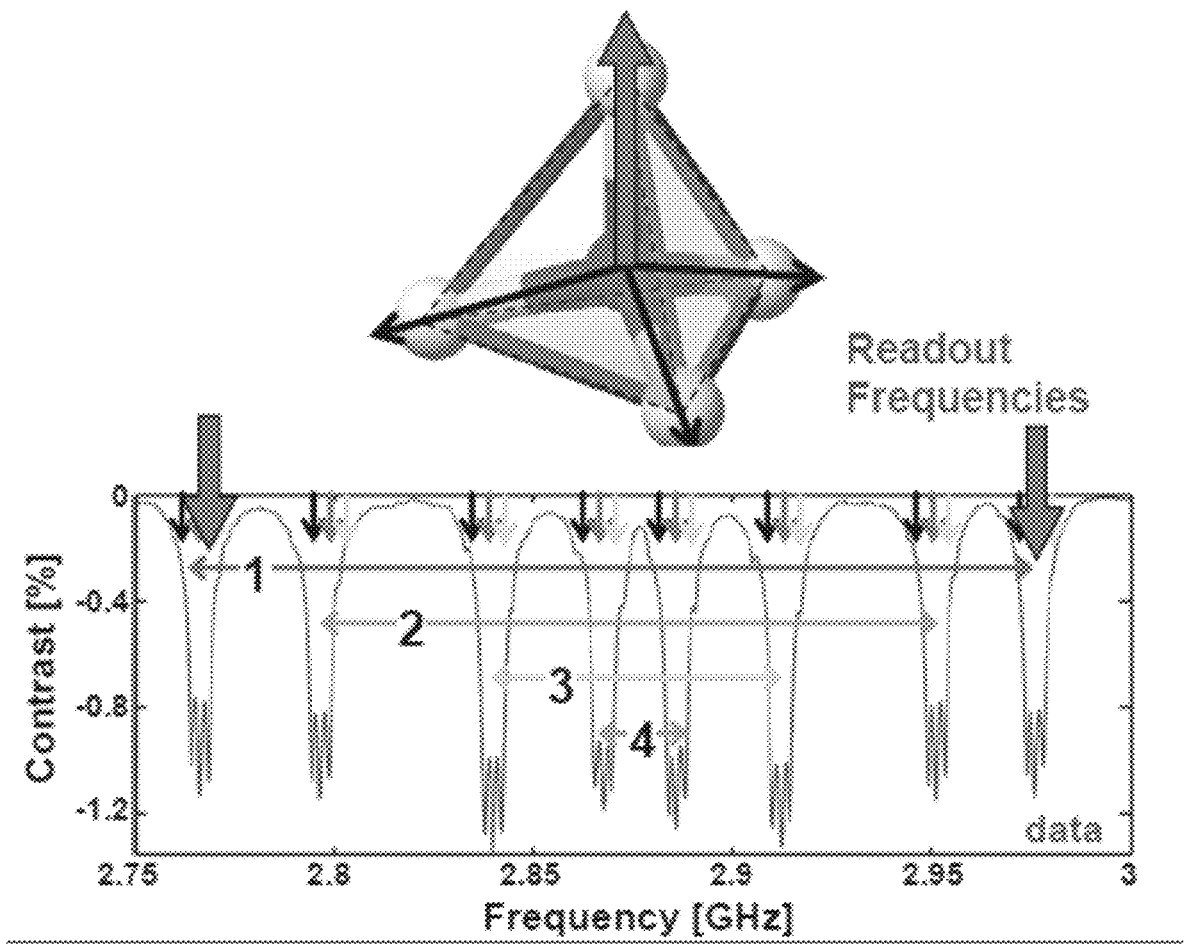

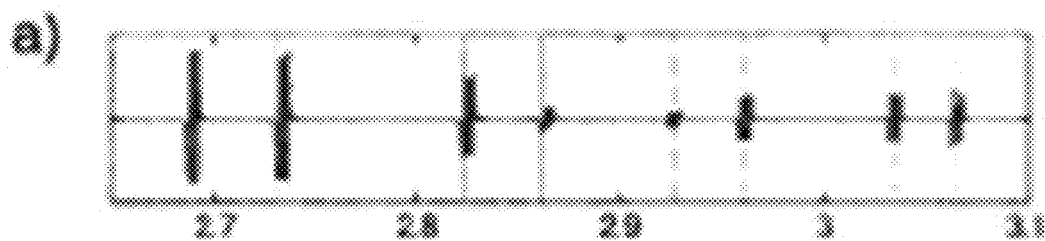
FIG. 6A
FIG. 6B
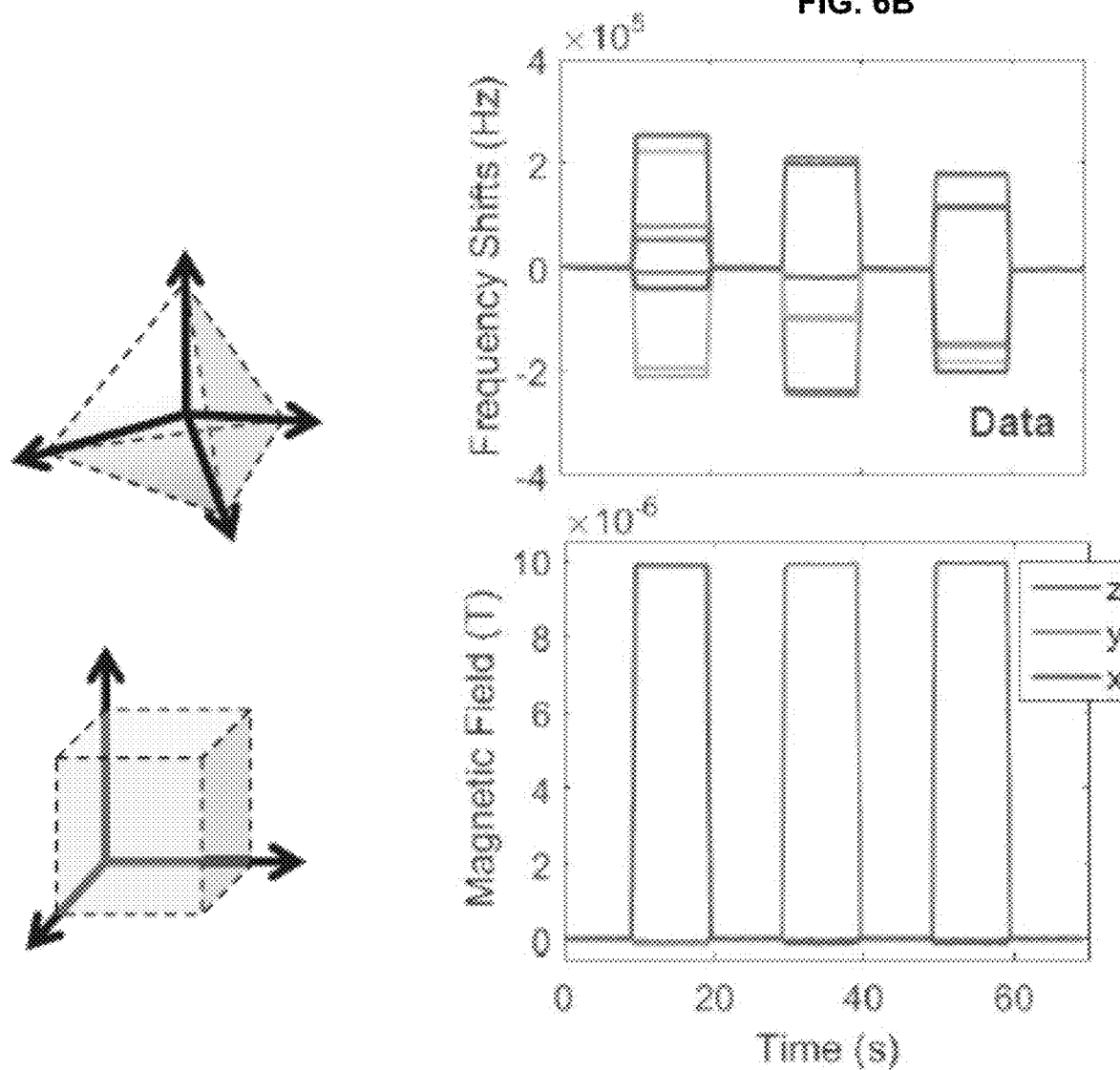
FIG. 6C

- Expected (balanced) shot noise limited sensitivity @ 1.8 W = 172 pT/√Hz
- Above shot noise by ~1.6 (due to 1/f noise from fmod) => 275 pT/√Hz measured shot noise ~ 300 pT/√Hz @ 50 Hz 200 pT/√Hz

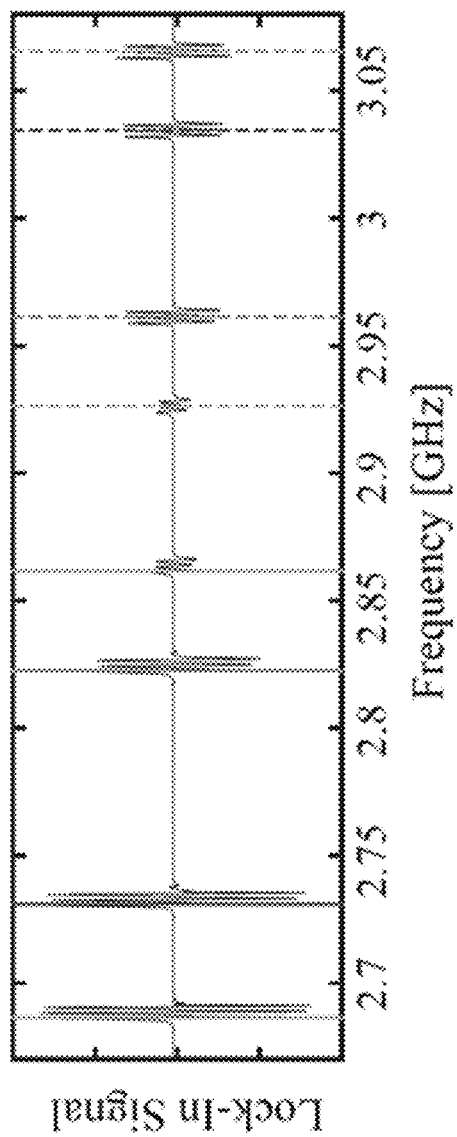
FIG. 17
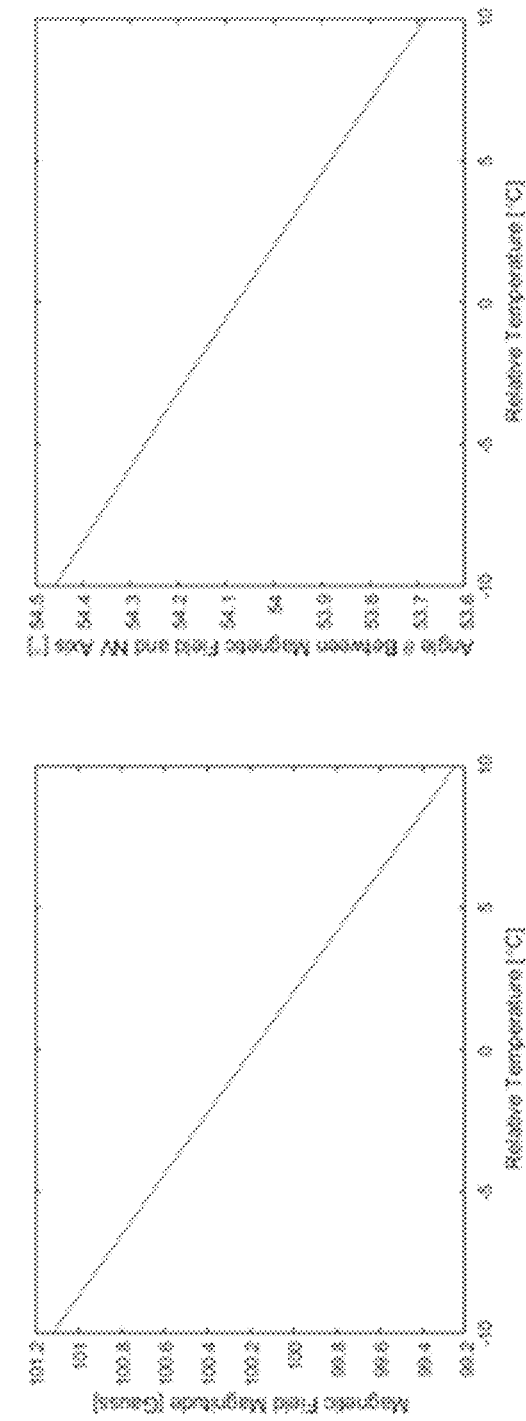
FIG. 18A
FIG. 18B

METHODS AND APPARATUS FOR OPTICALLY DETECTING MAGNETIC RESONANCE

CROSS-REFERENCE TO RELATED APPLICATION(S)

This application claims the priority benefit of U.S. Application No. 62/418,888, which was filed on Nov. 8, 2016, and is incorporated herein by reference in its entirety.

GOVERNMENT SUPPORT

This invention was made with Government support under Contract No. FA8721-05-C-0002 awarded by the U.S. Air Force. The Government has certain rights in the invention.

BACKGROUND

The nitrogen-vacancy (NV) center in diamond has a number of exceptional properties, including a long room-temperature spin coherence time (~1 ms), optical accessibility for spin initialization and detection, and embedding in a solid-state spin environment that can be engineered for a wide variety of applications. One application for which the NV center has shown particular promise is quantum sensing including magnetometry. A standard method of sensing magnetic fields with NV centers uses an optically detected magnetic resonance (ODMR) spectrum to determine the NV ground state transition frequencies which experience Zeeman splitting as a function of the applied magnetic field and are scaled only by fundamental constants. However, current NV magnetometers that employ this method rely on measurements of NV fluorescence intensity and are therefore susceptible to noise in the optical and microwave excitation sources used to perform ODMR measurements.

An earlier approach to ODMR-based NV magnetometry measured the full spectra and performed fits to extract the NV resonance frequencies. It involved spending a large fraction of the measurement time monitoring non-information-containing off resonance signal and was subsequently prohibitively slow.

Another earlier method used lock-in techniques to continuously monitor a single resonance on the approximately linear derivative of the curve, from which small resonance frequency shifts were detected by applying pre-calibrated scale factors. However, this second approach was still limited to the approximately linear regime of the lock-in signal resulting in a dynamic range of about 10 µT. Furthermore, this method was dependent on phenomenological variables instead of a true frequency shift. In particular, the scale factor was influenced by the NV resonance linewidth and contrast, both of which were affected by optical pump power, microwave power, and detection efficiency. These variables are different for each device and drift over time, consequently requiring periodic calibration.

A third earlier method employed a closed-loop feedback lock-in technique on a single resonance of a single NV center; however such an approach is not inherently suited to magnetic sensing, suffering from severe systematic errors due to, for example, time-varying temperature and magnetic field when applied to magnetic sensing. Furthermore, single-NV measurements are incompatible with vector magnetometry. In particular, none of the previous methods performed measurements on multiple NV resonances in an NV ensemble simultaneously; thus none were able to extract full magnetic field vector information in real-time, decoupled from the effects of temperature.

SUMMARY

Embodiments of the present invention include methods and apparatus for measuring magnetic field vectors. An example vector magnetometer comprises a solid-state host comprising an ensemble of color centers, oriented along several axes (e.g., the symmetry axes corresponding to the orientation classes of color centers) with respect to the crystal axis of the solid-state host, a microwave signal generator in electromagnetic communication with the solid-state host, a photodetector in optical communication with the solid-state host, circuitry (including, e.g., a lock-in amplifier) operably coupled to the microwave signal generator and the photodetector, and a processor operably coupled to the lock-in amplifier.

In operation, the ensemble of color centers of the vector magnetometer are driven with a first microwave signal from the microwave signal generator, and, in the presence of a magnetic field, the first ensemble of color centers emit a first fluorescence signal representing the first resonance. The circuitry (e.g., lock-in amplifier) is used to frequency-lock the first microwave signal to the first resonance based on the first fluorescence signal. The processor is used to determine an amplitude and/or direction of the magnetic field based on a frequency of the first microwave signal.

In some instances, the solid-state host of the vector magnetometer comprises a second ensemble of color centers oriented along a second crystal axis of the solid-state host and exhibiting a second resonance and a third ensemble of color centers oriented along a third crystal axis of the solid-state host and exhibiting a third resonance in the presence of the magnetic field. And the circuitry is configured to frequency-lock a second microwave signal to the second resonance and to frequency-lock a third microwave signal to the third resonance, such that the processor determines the amplitude and/or direction of the magnetic field based on a frequency of the second microwave signal and a frequency of the third microwave signal.

An example method of measuring the magnitude and direction of a magnetic field using the vector magnetometer can comprise frequency-locking the first microwave signal to the first resonance and determining an amplitude and/or direction of the magnetic field based on a frequency of the first microwave signal. Some other example methods can include frequency-locking several microwave signals to several resonances exhibited by the ensemble of color centers (e.g., a second or a third microwave signal frequency locked to the second or third resonance, etc.) and determining the amplitude and/or direction of the magnetic field based on a frequencies of the several microwave signals.

The first resonance exhibited by the ensemble of color centers can represent a first energy-level transition, such as a first hyperfine transition. The second resonance can represent a second energy level different from the first energy-level transition, which can also be a hyperfine transition. Similarly, the several resonances with the corresponding several microwave signals can each represent energy-level transitions that can be hyperfine transitions.

The processor can be configured to determine the amplitude and/or direction of the magnetic field based on the frequencies of the several microwave signals corresponding to the several resonances of the ensemble of color centers. For example, by taking a difference between the frequency of the first microwave signal and the frequency of the second microwave signal. The processor can determine the amplitude of magnetic field with a dynamic range of about 360 μT to about 100,000 μT.

A multi-channel frequency-locking NV magnetometer tied to fundamental constants and robust against phenomenological variables such as laser and MW power noise and drift, both of which limit previous lock-in based NV magnetometers, is especially useful for remote, in situ sensing applications. As described in detail below, using multiple frequency channels allows for the simultaneous measurement of more than one transition of an NV orientation class and consequently the isolation of the magnetic field from temperature variations.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 1A shows an example of a defect, here a nitrogen-vacancy (NV) center, in a crystal lattice.

FIG. 1B depicts a generalized energy level diagram showing the state transitions of an NV center from the ground state to an excited state and back through radiative and non-radiative pathways. The insets show the splitting of the degenerate spin states $m_s=\pm 1$ in the presence of a magnetic field along the NV symmetry axis. The degenerate $m_s=\pm 1$ states split in the presence of magnetic field $B_{NV}$ with an energy level separation $2\mu_B g_e B_{NV}$. Note that other defect centers can also show a similar effect of energy levels shifting in the presence of a magnetic field.

FIG. 1C shows a magnified view of the ground state of the energy level diagram in FIG. 1B while also including an example of hyperfine states for $^{14}$NV.

FIG. 2A shows a tetrahedral frame, which can correspond to an NV-diamond tetrahedral coordinate frame. The thin black arrows indicate possible orientations of, e.g., NV centers. For an external field oriented near the gray arrow, the sub-ensemble of NV centers aligned along the gray arrow would experience the largest energy shift.

FIG. 2B shows an example ODMR spectrum when NV centers of four different orientations are subjected to an applied magnetic field B that causes different Zeeman splittings (1 to 4) for each of the four possible NV orientation classes.

FIG. 6A shows an example experimental error spectrum illustrating hyperfine transitions of four NV orientations.

FIG. 6B shows frequency shifts experimentally measured from magnetic resonance of ensembles of NV centers in diamond, which has a tetrahedral lattice structure, to magnetic fields applied along the x, y, and z areas in a Cartesian frame of reference in an example experiment.

FIG. 6C shows an example of magnetic field measurements reconstructed from frequency shift measurements in FIG. 6B with color centers in a solid state host. The measured field information is transformed into a Cartesian reference frame labeled along x, y, and z.

Figure 12:
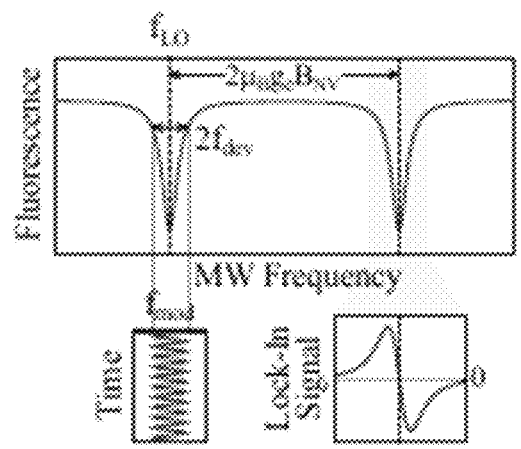

FIG. 12 shows an example optically detected magnetic resonance (ODMR) spectrum of an NV electronic spin in the presence of an applied magnetic field $B_{NV}$. The microwave signal $f_{mod}$ is generated by modulating $f_{LO}$ at frequency $f_{ref}$ with depth $f_{dev}$. The demodulated lock-in signal is shown for $f_{LO}$ near an NV resonance illustrating that the lock-in signal is zero when $f_{LO}$ is directly on resonance.

Figure 13:
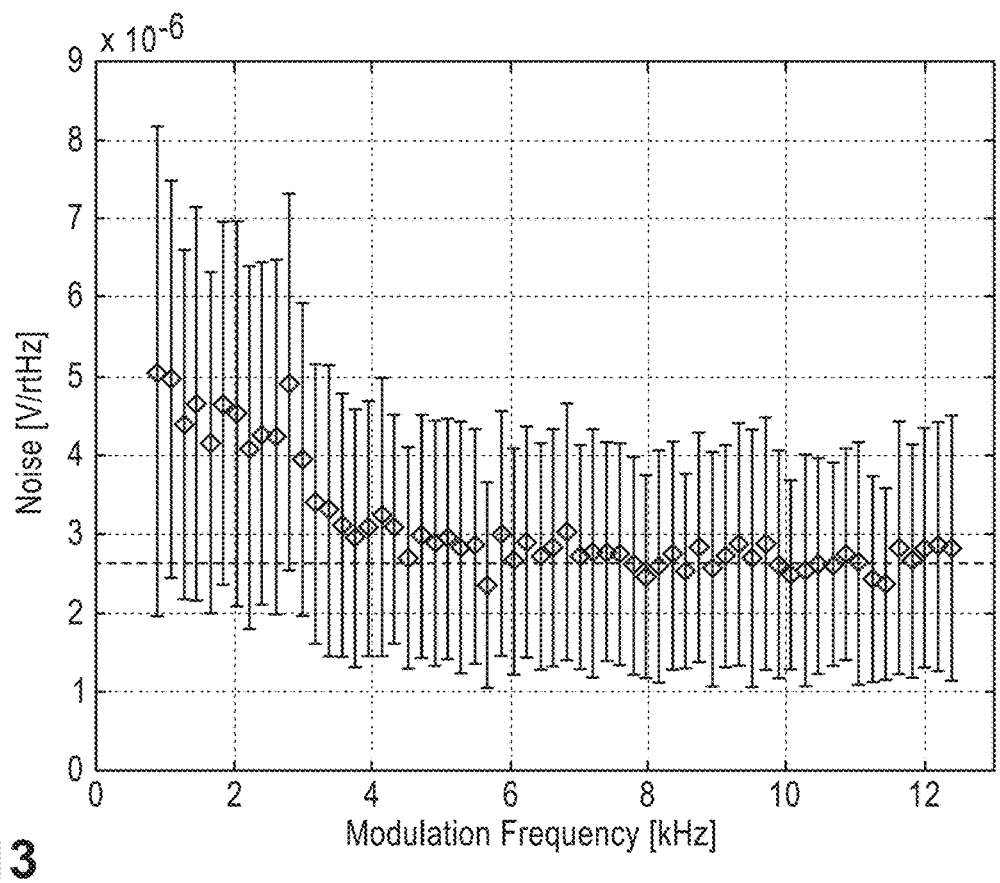

FIG. 13 is an example plot of lock-in signal noise as a function of modulation frequency. Note that above 4 kHz, the noise is shot-noise limited whereas below 4 kHz, 1/f technical noise dominates.

Figure 14:
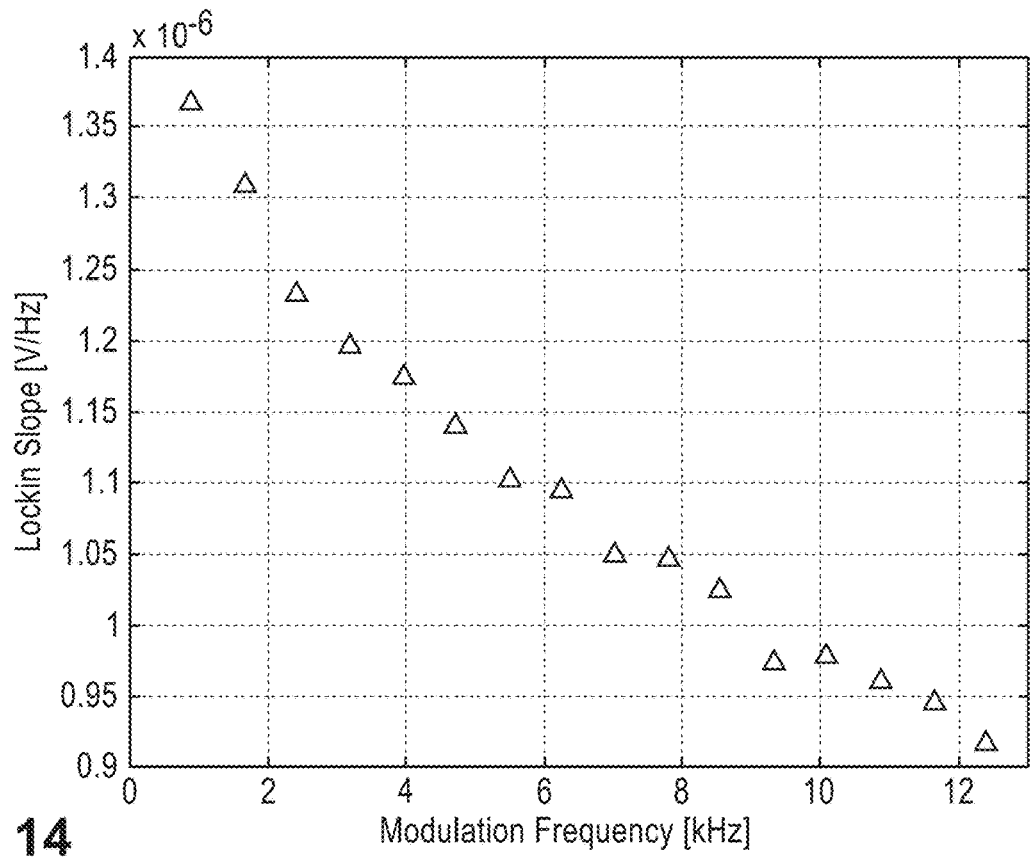

FIG. 14 is an example plot of NV system responsivity as a function of modulation frequency. Note that the responsivity and subsequently the sensitivity degrades for higher modulation frequencies.

Figure 15:
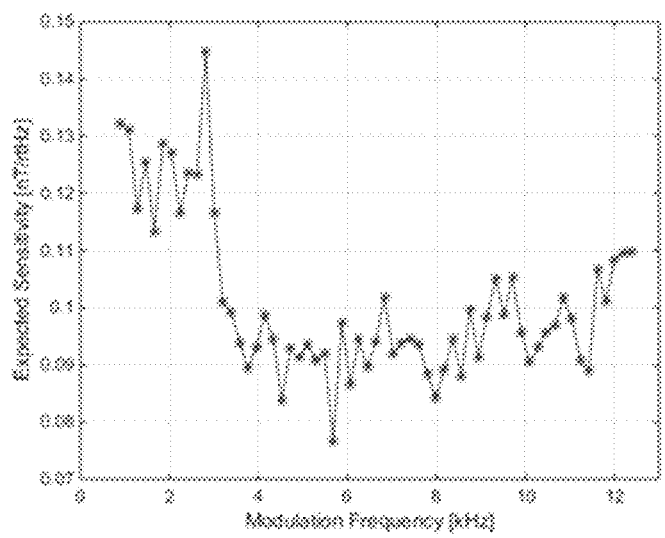

FIG. 15 is an example plot of magnetic sensitivity as a function of modulation frequency, indicating the limited range of modulation frequencies that give optimum magnetic sensitivity.

Figure 16:
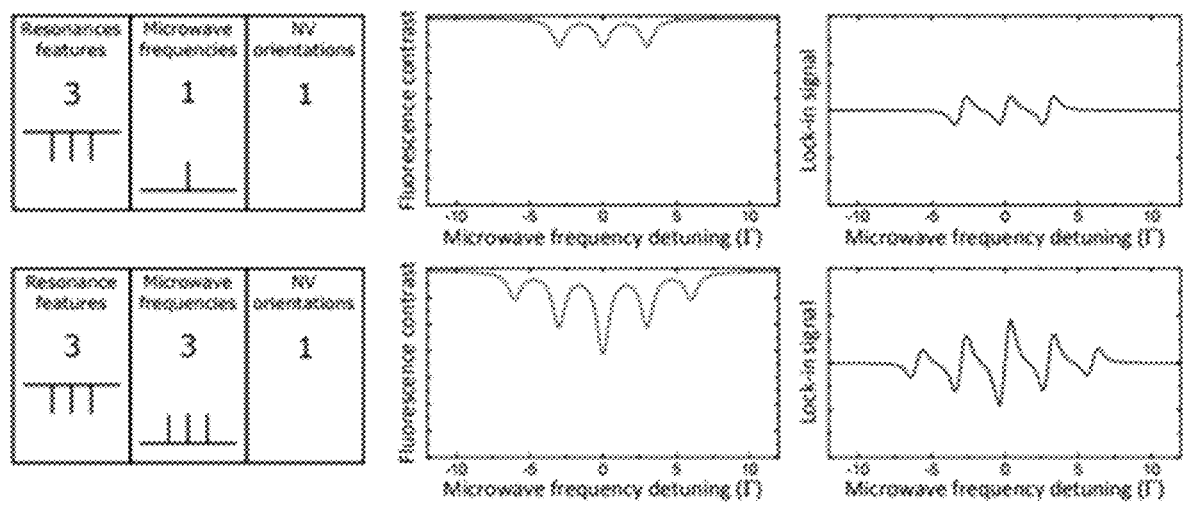

FIG. 16 is an example of difference in contrast (middle plots) and lock-in signal illustrating responsivity (right plots) of performing microwave driving without sideband modulation (top plots) and with sideband modulation tuned to the NV hyperfine splitting (bottom plots).

FIG. 17 is an illustration of driving different hyperfine transitions of an NV resonance in an NV ensemble.

FIGS. 18A and 18B are example illustrations of how a single pair of NV resonance frequencies (2.732481 GHz, 3.061399 GHz] can yield a range of extracted values for temperature, magnetic field direction, and magnetic field magnitude.

Figure 19:
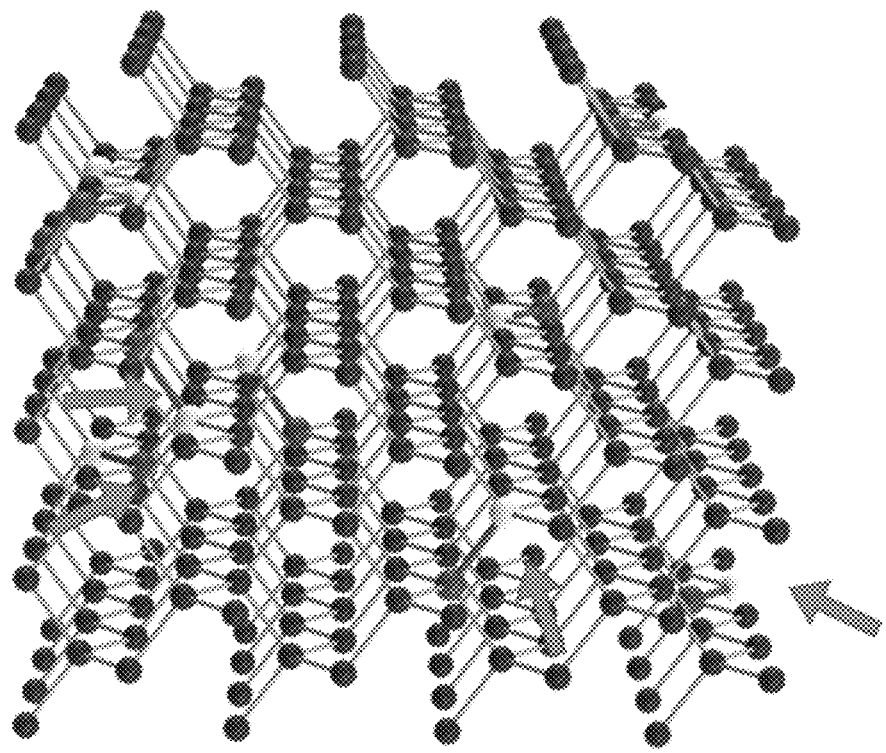

FIG. 19 is a diagram of a bulk diamond crystal containing many unit cells to illustrate the four possible NV orientation classes, examples of each are indicated by arrows. Carbon atoms are black, substitutional nitrogen atoms are blue, and vacancies are white; the NV symmetry axis is shown in red. Note that each orientation class comprises two orientations that have the same symmetry axis but where the relative positions of the N and V are switched.

Figure 20:
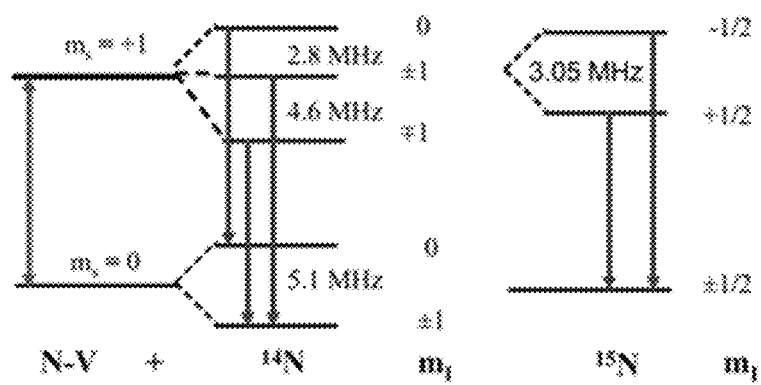
Figure 21B:
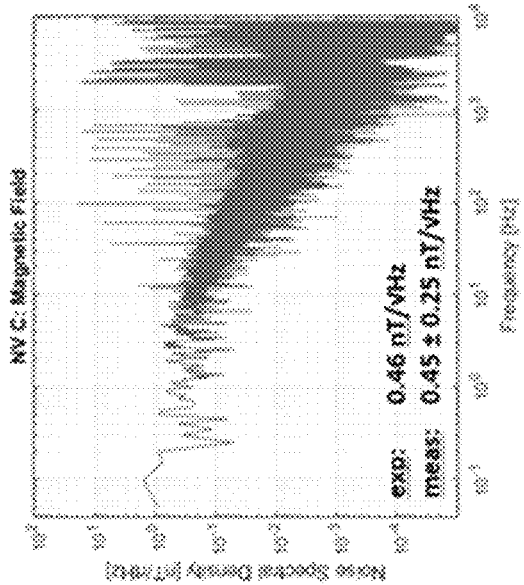
Figure 21D:
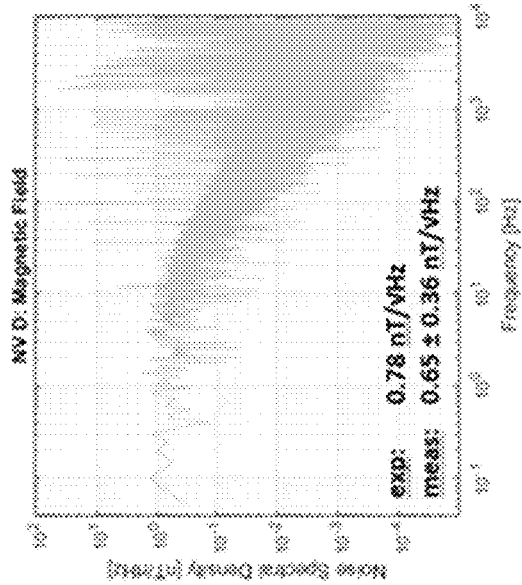
Figure 21A:
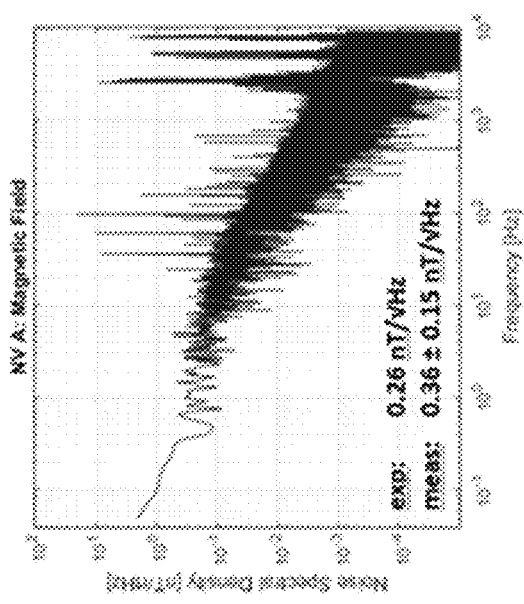
Figure 21C:
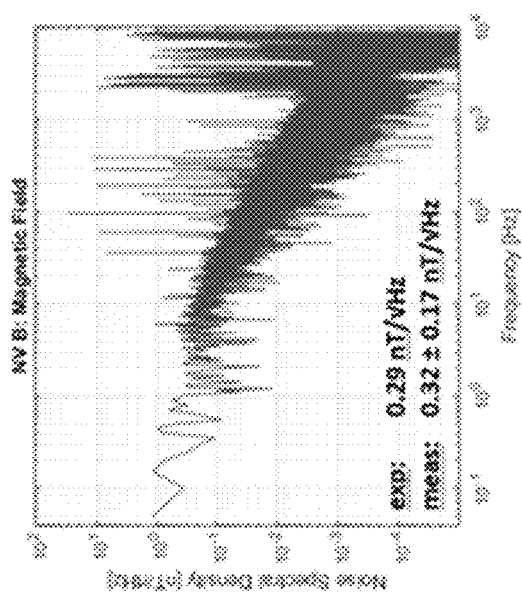

FIG. 20 is a schematic diagram of NV hyperfine structure when the substitutional nitrogen is the $^{14}$N isotope of nitrogen (left) and when the substitutional nitrogen is the $^{15}$N isotope of nitrogen (right), including the dipole-allowed transitions between the hyperfine states.

FIGS. 21A-21D are noise spectra extracted from simultaneous 8-channel frequency-locking measurements to illustrate the magnetic sensitivity of each of the four possible NV orientations. The shot-noise-limited expected sensitivity and sensitivity as measured over a frequency range below the 10 Hz roll-off of the lock-in amplifier and/or frequency-locking feedback controller are shown for each NV orientation class.

Figure 22B:
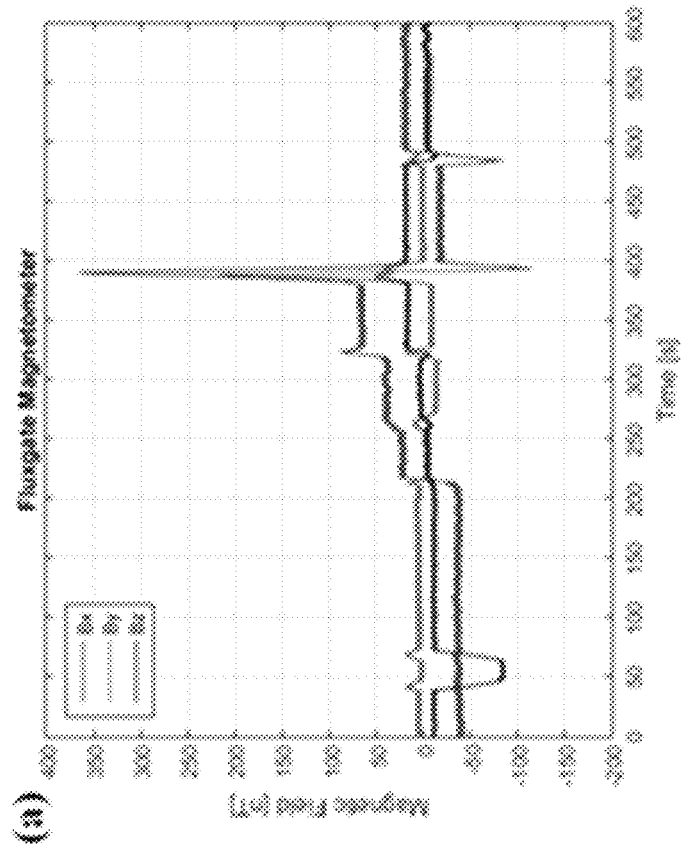
Figure 22A:
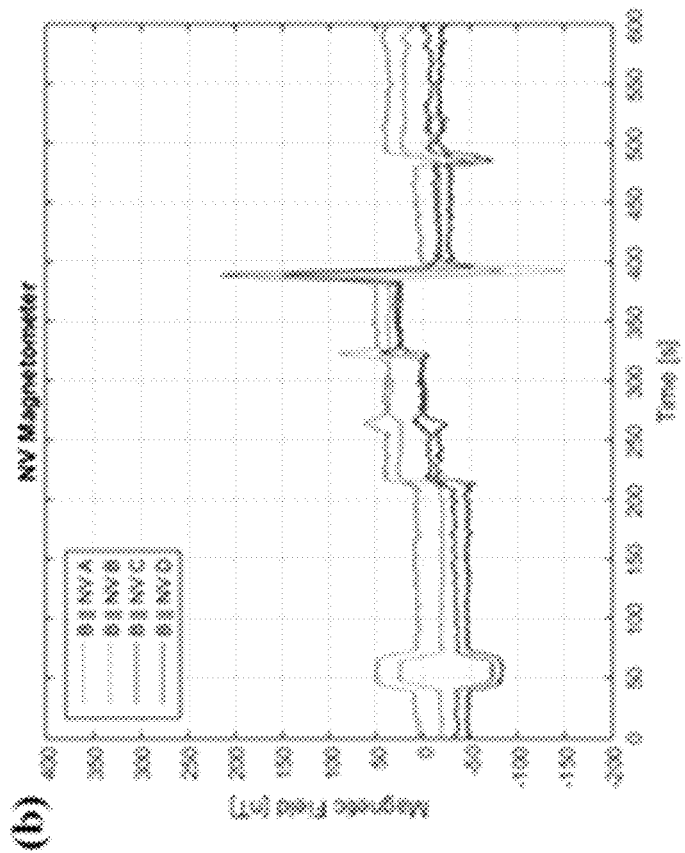

FIGS. 22A and 22B are plots illustrating measurements of a varying magnetic field using a commercial fluxgate magnetometer and an NV magnetometer, respectively, for comparison. Note that the magnetometers were placed in proximity to each other but not co-located; however, the magnetic field experienced by both sensors is expected to be comparable since changes to the field were induced by moving large magnetic objects situated far away from the sensors.

Figure 23:
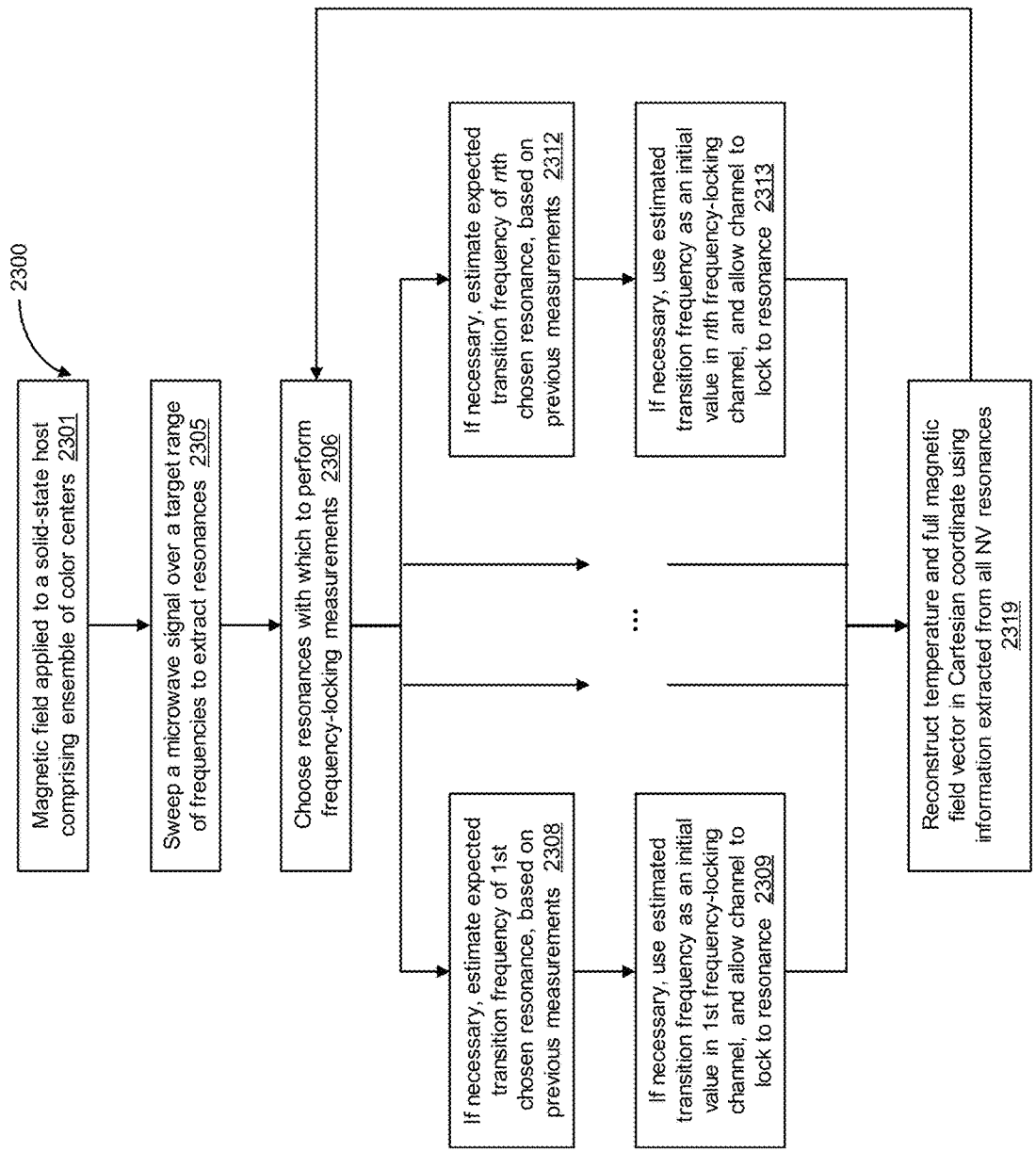

FIG. 23 shows an example method of measuring magnetic fields using a sequential vector magnetometer based on the spin states of an ensemble of solid-state defects.

DETAILED DESCRIPTION

Introduction

In recent years, solid-state magnetometers and in particular NV-diamond magnetometers have shown utility in several modalities: as electric field sensors of both alternating current (AC) and direct current (DC) signals, as well as performing measurements of magnetic field through, for example, high-resolution scanning of a single NV center, simultaneous wide-field imaging of an NV ensemble located in a thin layer near the surface of a diamond, and high-sensitivity measurements with a large NV ensemble in bulk diamond, with demonstrated magnetic sensitivity down to <1 pT/√Hz. Due to the many useful properties of both NV centers and diamond, NV-based magnetometers promise to rival the sensitivity and long-term stability of atomic magnetometers, while possessing a number of additional advantages, such as intrinsic vector capability and a compact, solid-state package, not inherent to atomic magnetometers.

One approach to sensing magnetic fields with NV centers uses optically detected magnetic resonance (ODMR) measurements to determine the NV ground state transition frequencies, which experience Zeeman splitting as a function of the applied magnetic field and are scaled only by fundamental constants, such as the spin, Plank's constant, Bohr magneton, etc. However, some versions of current NV magnetometers that employ this method rely on measurements of NV fluorescence intensity and are therefore susceptible to noise in the optical and microwave excitation sources used to perform ODMR, while others perform measurements only on single resonances of single NV centers and are therefore both susceptible to noise in temperature as well as incapable of full vector measurements.

In contrast, an inventive NV magnetometer uses a closed-loop, frequency-locking scheme to directly measure multiple Zeeman-split NV resonance frequencies in an NV ensemble, simultaneously. There are a number of significant advantages of this technique over open-loop methods: (1) the elimination of steady-state dependence on variable parameters, such as NV resonance contrast and linewidth, resulting in a more robust measurement; and (2) an increase in the dynamic range to ≥10 mT, corresponding to a factor of about 1,000 improvement. Furthermore, by using this frequency-locking technique on an ensemble of NV centers in diamond to simultaneously detect more than one resonance frequency and/or rapidly interleave measurements of resonance pairs of NV centers oriented along some or all of the four diamond crystallographic axes, an inventive magnetometer can perform real-time measurements of the full magnetic field vector, decoupled from temperature effects. Note that the ultra-stable diamond crystal lattice, with even further stability attained by averaging over the ensemble, also provides a significantly more reliable measure of the vector angle when compared to vector measurements formed from three orthogonal scalar magnetometers, which are limited by machining tolerances.

Briefly, the magnetometer functions by reporting the spin state of NV centers embedded in a diamond crystal host. Ensembles of NV centers absorb optical and microwave energy in order to transition between energy levels, while simultaneously emitting photoluminescence. The intensity of emitted light can be used to identify the average spin state of an ensemble of NV centers given that transitions between certain states are preferably non-radiative compared to transitions between others. The resonance frequencies corresponding to the transitions of NV ensembles are affected by the presence of a magnetic field through the Zeeman Effect. By using the optical readout in a closed-loop manner, an inventive magnetometer locks microwave signals to the transitions, thereby directly measuring the NV resonance frequencies. NV centers of a particular orientation can be used to extract magnitude and direction information of the local magnetic field by simultaneously measuring the pair of resonance frequencies associated with that particular NV orientation. Further, NV ensembles of different orientation classes are differently affected by a magnetic field of a given direction. This orientation dependence can be used to measure the amplitude of the magnetic field perceived by each orientation class and thus to extract full vector information of the magnetic field. Alternatively, as discussed later, a subset of at minimum four NV resonances is sufficient to extract the full magnetic field vector.

Without being bound or limited by any particular theory, this application discloses a theory of operation and examples of methods and apparatus for measuring and quantifying transitions between electronic states (sensitive to magnetic fields) of an ensemble of nitrogen-vacancy (NV) centers. It includes example experimental measurements to determine the magnitude and direction of an external magnetic field or an intrinsic magnetic field under ambient temperature. An external magnetic field may be an ambient magnetic field in which the magnetometer apparatus is placed, or in some instances, a static or variable magnetic field may be applied using a suitable mechanism. For example, Helmholtz coils or permanent magnets can be used to deliver or apply a magnetic field. In some instances, the external magnetic field can also be intrinsic to a material. In such instances, the material to be examined can be embedded with a crystal host comprising of NV centers, and the embedded NV centers can be used to measure and report the local magnetic field within the material. Note also that many of the techniques, operational modes, and processes discussed in this patent application can be generally applied non-spherically-symmetric point defects in solid-state systems.

In summary, the present application describes an implementation of a multi-channel frequency-locking NV magnetometer, with long-term stable magnetic field measurements that are tied to fundamental constants, robust against phenomenological variables such as laser and MW power noise and drift, and overcome the limited dynamic range of some of the previously demonstrated NV magnetometers. The magnetometer system described in the present application includes simultaneous measurement of more than one resonance frequency of NV center ensembles, allowing for the extraction of the full magnetic field vector, decoupled from the effects of temperature (e.g., variations). In several modes of operation, the full magnetic field vector and temperature information can be fully extracted in real-time from simultaneous measurements of multiple NV resonances without systematic errors or 1/f noise behavior such as are observed in sequential measurements. This is especially valuable for remote, and in situ sensing applications, particularly for a device operating in a moving and/or rotating ambient magnetic field and/or operating on a moving and/or rotating platform in an ambient magnetic field. In these situations, noise due to moving and/or rotating magnetic fields and/or platforms is correlated between magnetic field projections along different vector axes and can therefore their effects can be removed in processing. Note also that additional robustness against moving and/or rotating ambient magnetic fields and/or platforms may be afforded by the overdetermined nature of the NV-diamond tetrahedral geometry.

Nitrogen-Vacancy Centers in Diamond

A crystalline solid has a structure that comprises repeating units of atoms or molecules over lattice points. Imperfections in this arrangement can occur as point defects in the crystal structure, e.g. coinciding with given lattice points. Types of point defects in crystal hosts can include vacancy defects where lattice sites are left vacant, substitutional defects where the atom or molecule at a given lattice site is replaced with a different atom or molecule, and interstitial defects where the atom or molecule is between lattice cites. These point defects result in a redistribution of charge densities and other properties, associated with the lattice site. Crystal hosts can also include point defect complexes formed by defects on adjacent lattice sites. For example, in diamond, which is generally composed of carbon atoms in a tetrahedral crystal lattice, the nitrogen-vacancy (NV) defect comprises a substitutional nitrogen replacing a carbon atom and a vacancy, or missing carbon atom, on adjacent lattice sites.

Figure 1A:
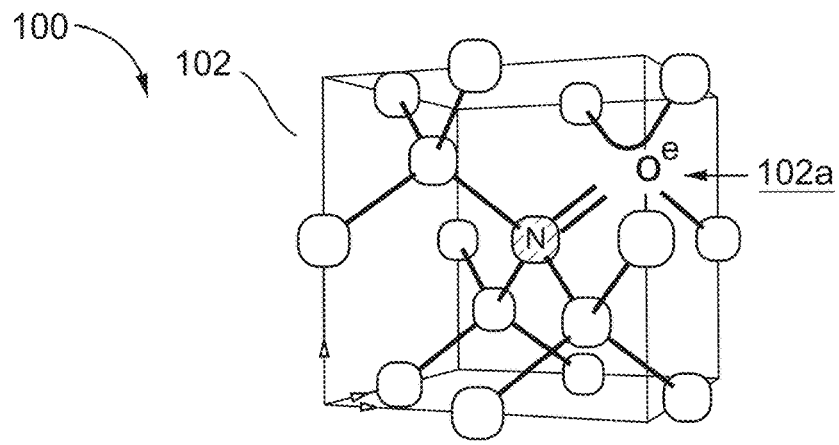

The NV center can be incorporated in the diamond crystal with high defect density, allowing for a very large ensemble of centers to occupy a very compact volume, useful for a compact sensor, discussed in a later section of this patent application. As a specific example, the crystal host can be bulk diamond 100 containing nitrogen vacancy (NV) centers as illustrated in FIG. 1A. The NV center 102 shown along one crystal direction in the diamond host 100 comprises a substitutional nitrogen atom (N) in a lattice site adjacent to a vacancy (V) 102a. The carbon atoms surrounding the NV center are each labelled C. The NV center may occupy any of eight possible orientations (four orientation classes containing symmetric pairs) corresponding to the location of the substitutional nitrogen atom with respect to the vacancy. Examples of NV centers of each orientation class are indicated by green arrows in FIG. 19.

An NV center can exist in a negatively-charged state NV$^-$ (generally referred to simply as NV) or a neutral-charge state NV$^0$. An NV center in the negatively-charged state has an additional electron in addition to the five dangling bond electrons, one each from the carbon atoms and one pair of electrons between the vacancy and the nitrogen atom. NV$^-$ and NV$^0$ can be optically distinguished by their ZPLs (zero phonon lines) at 637 nm and 575 nm, respectively.

Figure 1B:
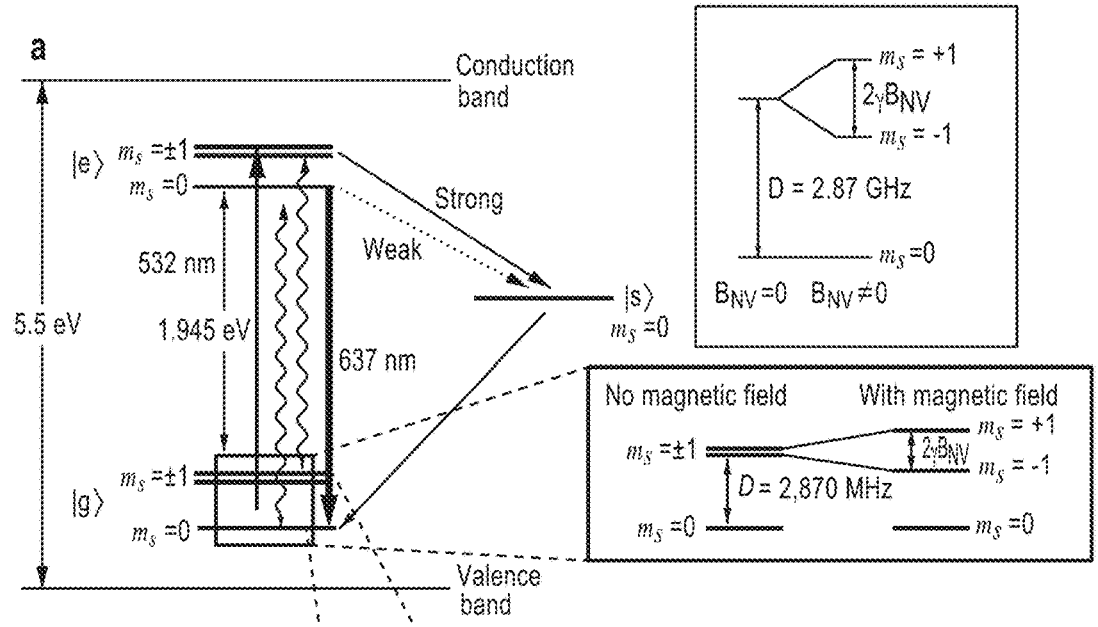

The negatively charged NV center has electronic spin S=1 with a triplet ground state where $m_S$=0 and degenerate $m_S$=±1 spin sublevels experience a $D_{gs}$≈2.87 GHz zero-field splitting under ambient conditions and no applied fields as shown in FIG. 1B. Under a non-zero magnetic field, the $m_S$=±1 levels are no longer degenerate as shown in the inset in FIG. 1B. As a specific example, in the presence of a magnetic field $B_{NV}$ oriented along the NV symmetry axis, the $m_S$=±1 spin sublevels experience Zeeman splitting given by $2\gamma B_{NV}$. Note that this splitting is proportional to the magnitude of the magnetic field, scaled by fundamental constants $\gamma=2\mu_B g_e$≈2.8 MHz/G (FIG. 1B).

More generally, the ground-state energy levels experience further modification in the presence of local strain, electric field, and magnetic fields as approximated in the following NV Hamiltonian:

$$H_{gs} = \left(hD_{gs} + d_{gs}^{\|}\prod_s\right)\left[S_z^2 - \frac{1}{3}S(S+1)\right] + \qquad (1)$$

$$\mu_B g_c S \cdot B - d_{gs}^{\pm}\left[\prod_x (S_x S_y + S_y S_x) + \prod_y (S_x^2 - S_y^2)\right]$$

Additional terms in the Hamiltonian provide increased accuracy.

Figure 8A:
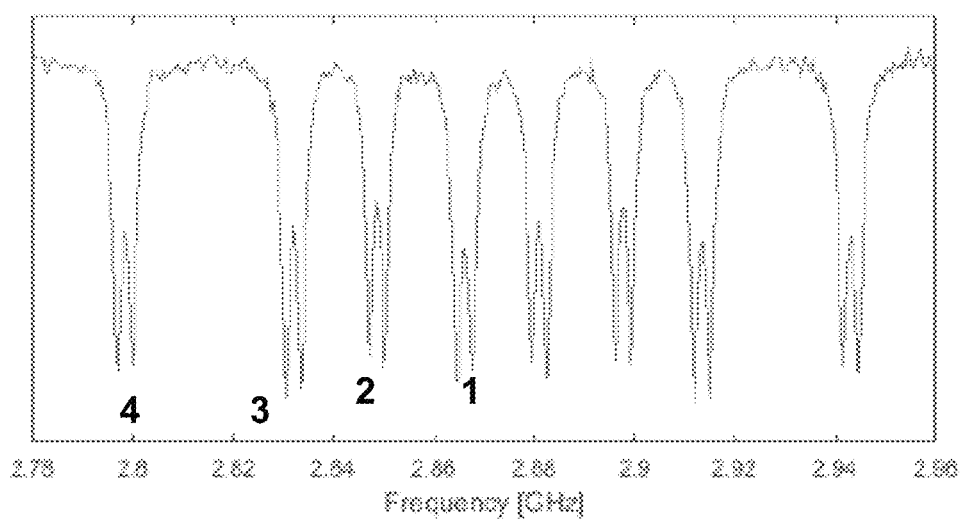
FIGS. 8A and 8B show example ODMR spectra resulting from hyperfine transitions in the presence of a magnetic field, from ensembles of two different types of NV centers, namely $^{14}$NV and $^{15}$NV.
Figure 8B:
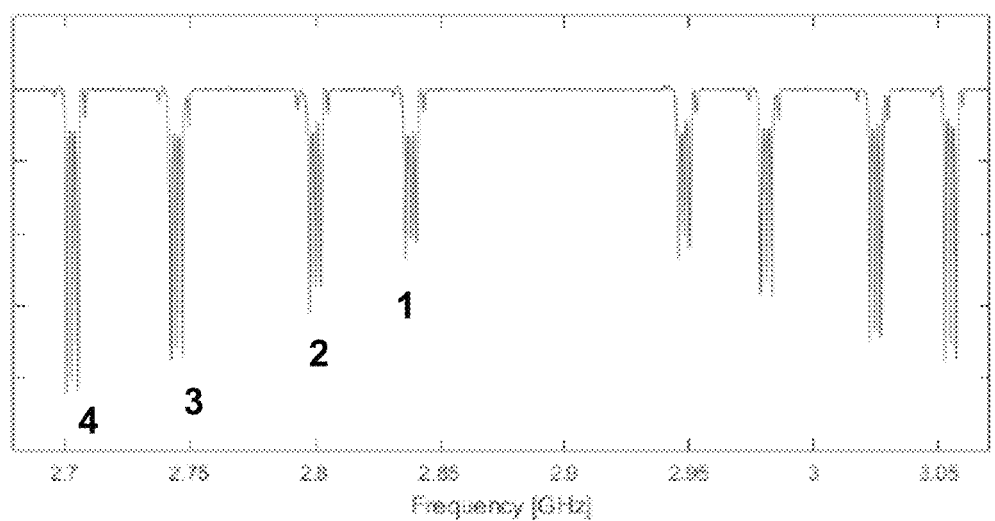

Hyperfine interactions between the NV electronic spin and the nuclear spin of the nitrogen atom that makes up the NV cause further splitting in the spin sublevels of the ground-state. This hyperfine structure along with the allowed dipole transitions are shown for the two most common nitrogen isotopes ($^{14}$N, =1 and $^{15}$N, I=½) in FIG. 1C ($^{14}$N) and FIG. 20 ($^{14}$N and $^{15}$N). FIGS. 8A and 8B show the ODMR spectra (described in greater detail below) of NV ensemble measurements, taken in the presence of an arbitrary external magnetic field, using vector magnetometers with crystal hosts in which the nitrogen atoms are predominantly the $^{14}$N isotope (FIG. 8A) or predominantly the $^{15}$N isotope (FIG. 8B), respectively. FIGS. 8A and 8B illustrate the effect of different hyperfine states in the NV hyperfine structure.

A number of particularly useful properties of the NV center originate from the system's behavior under optical excitation. FIG. 1B shows a schematic of the energy level diagram when an exemplary NV center is optically excited to transition from the ground (triplet) state |g> to an excited triplet state |e>, using excitation light of 532 nm (green arrow). In particular, excitation via optical photons containing energy equal to or greater than the NV 637-nm zero-phonon line causes the NV center to transition from the ground state |g> to the excited state |e>, where the excited state |e> is also a triplet state with three spin-sublevels denoted by $m_S$=0, $m_S$=+1, and $m_S$=−1. One possible relaxation pathway for the excited NV center to return to the ground state |g> is with the emission of a photon, with wavelength typically in the range of 637-800 nm. That is, the transition from the excited state to the ground state can be effected by emitting a photon whose energy corresponds to the energy gap between the energy levels of the transition, for the zero-phonon line, or the energy gap minus the energy of a phonon in the case of the phonon sidebands. For the most part this optical excitation and subsequent fluorescence process maintains the spin state of the NV center.

Another relaxation pathway for the NV to transition from the excited state |e> to the ground state |g> is via intermediate states |s> containing a singlet spin state $m_S$=0, as depicted in FIG. 1B. This alternative path involves little to no visible photon emission, being mostly non-radiative. Further, the fine structure levels $m_s$=±1 in the excited state generally have a higher likelihood of taking the non-radiative path over the excited state $m_S$=0 sublevel, as indicated by the solid and dotted arrows in FIG. 1B.

Due to the higher likelihood of the transition from excited $m_s$=±1 via the non-radiative path, the intensity of optical emission can be used to determine the spin state of one or more NV centers. That is, the more NVs in the $m_s$=±1 instead of the $m_s$=0 state, the lower the average fluorescence intensity. Consequently, by measuring the NV fluorescence intensity, the spin state of a single NV center or the average spin state of an ensemble of NV centers can be extracted. Additionally, the unequal transition probability rates between the $m_S$=0 and $m_S$=+1 sublevels in the excited state, to the singlet state, to the $m_S$=0 and $m_S$=±1 sublevels in the ground state result in enriched population of the $m_S$=0 spin sublevel under prolonged optical excitation.

To summarize, the dynamics of the NV system under optical excitation yield two significant and useful behaviors: (1) the NV fluorescence intensity reflects and thus provides a measure of the NV spin state and (2) the NV is eventually polarized into the $m_S$=0 ground state under optical excitation. The timescale for the polarization into the $m_S$=0 ground state to saturate is a function of the optical excitation intensity, capable of reaching full polarization within several hundred nanoseconds (~300 ns) at the optical saturation intensity of the NV center.

NV-Diamond Magnetometry

As mentioned previously, one approach to performing magnetic sensing with NV centers is through optically detected magnetic resonance (ODMR) measurements, which take advantage of the behavior of the NV system under optical excitation to measure the transition frequencies between the NV electronic energy levels and the dependence of the NV electronic energy levels on magnetic fields. ODMR measurements also take advantage of the fact that microwave radiation that is resonant with, i.e. equal to the difference between, certain electronic energy levels can cause transitions between those electronic energy levels.

Figure 1C:
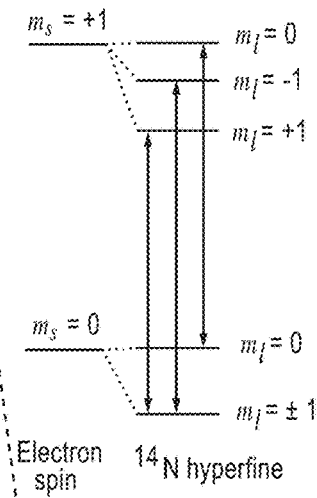

In the NV spin system, MW excitation that is resonant with so-called dipole-allowed transitions, indicated by the arrows in FIG. 1C for $^{14}$NV and in FIG. 20 for $^{14}$NV and $^{15}$NV, can cause the NV spin state to transition between the two energy levels connected by the transition. Note, also, that under certain circumstances, resonant MW excitation can drive even the so-called "forbidden" transitions.

Applying continuous optical and MW excitation while sweeping the frequency of the MW drive can yield an ODMR spectrum from which the transition frequencies of the NV system can be extracted. When the MW drive frequency is not resonant with any transitions, the optical excitation pumps the NV spin into the $m_S$=0 state and the NV fluoresces with maximum intensity. However, when the MW is resonant with a transition (generally an $m_S$=0-1 or $m_S$=0→+1 transition), some of the NV population is cycled into the $m_S$=±1 state resulting in a reduced NV fluorescence intensity. When the MW drive frequency is swept, these reductions in fluorescence intensity corresponding to allowed transition frequencies manifest as resonance dips. In this way, we can perform spectroscopy to determine the NV ground-state transition frequencies and thus extract, e.g., the magnetic field (among other physical phenomena). Given the $D_g$s 2.87 GHz zero-field-splitting of the NV center, a typical MW frequency sweep range for an NV ODMR spectrum may be from about 2.65 GHz to about 3.1 GHz. Other instances of measuring an NV ODMR spectrum can involve sweeping the MW frequency across other suitable or appropriate ranges, as desired.

A collection of NV centers, such as the NV 102, within the bulk diamond host 100 is referred to as an ensemble of NV centers and can be used to measure the magnitude and/or direction of magnetic, electric, and strain fields applied to the diamond host 302. Recall that due to the tetrahedral structure of the diamond crystal, NV centers may occupy any of eight possible orientations, corresponding to four orientation classes (where each orientation class contains two orientations with the same symmetry axis but where the N and V are in opposite lattice sites). Each NV center (particularly those in different orientation classes) may experience a different local field and hence exhibit a different change in resonance frequency, which can be measured using ODMR through changes in the average emitted photoluminescence due to MW driving of NV spin state transitions.

Later in this patent application, we will describe a family of inventive techniques that allow for the simultaneous measurement of multiple NV resonances across multiple NV orientation classes in an ensemble rather than as a (sequential) sweep. Using this family of techniques, each NV orientation class can simultaneously report on the average spin-state in that orientation and therefore on the magnetic field, electric field, or other physical phenomena perceived in that orientation. In particular, each NV orientation class is generally most sensitive to magnetic field projections along their symmetry axis. Consequently, measuring an NV ensemble, which contains NVs in all four orientation classes, automatically yields full magnetic field vector information, where the vector axes are tied to the stable diamond lattice.

An example NV ensemble ODMR spectrum is shown in FIG. 2B, with an external magnetic field producing different magnetic field projections along each of the four symmetry axes corresponding to the four NV orientation classes. A diagram of a tetrahedron illustrating the NV Diamond tetrahedral coordinate frame of reference is shown in FIG. 2A, with the four possible orientations of the NV symmetry axis (dark thin arrows) are superimposed by the direction of magnetic field (thick light arrow). That is, one can picture the tetrahedron as a diagram of the NV center where the substitutional nitrogen occupies the dark central lattice site and the vacancy may occupy any one of the four corner lattice sites.

Note that the example NV ensemble ODMR spectrum of FIG. 2B does not correspond to the magnetic field direction indicated in the diagram of FIG. 2A. The magnetic field applied to an NV ensemble to yield the ODMR spectrum of FIG. 2B has unequal projections along each of the four symmetry axes corresponding to the four NV orientation classes, with the resonance pairs corresponding to each of the four NV orientations labeled by horizontal arrows and indicated with labels 1-4 in order of highest magnetic field projection along the NV symmetry axes (1) to lowest magnetic field projection along the NV symmetry axis (4). Note that due to the separation in the energy level, transitions to the $m_s$=+1 and −1 levels can be distinguished in an ODMR measurement by their different frequencies corresponding to the different energy separations.

Note that the example ODMR spectra in FIG. 2B are obtained by sweeping the MW frequency and are therefore sequential rather than simultaneous measurements of each of the NV resonances. However, only by measuring multiple NV transition frequencies simultaneously can the effects of temperature and magnetic field, which both shift the NV resonances, be decoupled to extract the projection of the magnetic field along the NV symmetry axis. Inventive techniques for performing simultaneous measurements on NV ensembles, using some embodiments of the inventive vector magnetometer, are described below in this patent application.

NV-Diamond Magnetic Sensitivity

In a specific example where the readout mechanism of the spin state is optical, the optimum, shot-noise-limited sensitivity of an NV-based magnetometer is dependent on several factors encompassed in the equation below:

$$\eta \propto \frac{h}{g_e \mu_B} \frac{1}{\alpha \sqrt{\beta NT}} \quad (2)$$

where h, $g_e$, and $\mu_B$ are fundamental constants; $\alpha$ is the contrast of the measurement (related linearly to the responsivity of the NV system in lock-in based measurements discussed later in the patent application), $\beta$ is the average number of photons collected per NV, N is the number of NV sensors, and T for the ODMR measurements described previously is $T_2^*$, inversely related to the linewidth of the NV resonances. These factors are related to the diamond material properties and the device implementation, which can both be engineered and optimized for different measurement modalities.

Various inventive techniques that can be employed to improve contrast a (or NV system responsivity as discussed later), to improve measurement duty cycle, or to weight contributions of measurements from different NV orientation classes depending of various factors (e.g., the degree of magnetic field projections along the symmetry axes of each orientation class), are described herein. The latter two are considerations that are not encompassed in Equation (2). However, we note that from the number of NV sensors N, there is a potentially substantial improvement to magnetic sensitivity from performing measurements on large NV ensembles, such as afforded by the high defect densities that can be incorporated into compact solid-state volumes. An alternative way to view the improvement to magnetic sensitivity afforded by performing ensemble measurements is that ensemble measurements yield higher total fluorescence signal, resulting in higher signal-to-noise ratio and thus allowing shorter measurement times to reach a given minimum detectable field.

Frequency-Locking Techniques for NV-Diamond Magnetometry

Introduction

Previous demonstrations of ODMR-based NV magnetometry measured full spectra and performed fits to extract the NV resonance frequencies. These methods involve spending a large fraction of the measurement time monitoring non-information-containing, off-resonance signal and is subsequently prohibitively slow for some applications. Fitting the curves also introduces latency that may be incompatible with real-time sensing.

More recent demonstrations used lock-in techniques to continuously monitor a single resonance on the approximately-linear derivative section of the spectral feature, from which small resonance frequency shifts were detected by applying pre-calibrated scale factors. However, this second approach is limited to the approximately linear regime of the lock-in signal, resulting in a dynamic range of a few μT. Furthermore, this method is inherently dependent on phenomenological variables instead of a true frequency shift. In particular, the scale factor is influenced by the NV resonance linewidth and contrast, both of which are affected by optical pump power, microwave power, and detection efficiency. These variables are different for each device and will also drift over time, consequently requiring periodic recalibration.

The present application describes a magnetic field sensing apparatus and implementation of the apparatus with a closed-loop system that directly locks the microwave drive field to one or more NV resonances, thus isolating the magnetic field measurement from the phenomenological variables that determine the scale factor of previous lock-in-based approaches. This frequency-locking technique is similar to that employed canonically in atomic Mz type magnetometers previously and, more recently, demonstrated on single NV centers in diamond. The technique presented here is extended to perform measurements on multiple NV resonances simultaneously, to fully decouple temperature from magnetic field, and apply it to an NV ensemble to extract the full magnetic field vector, thus demonstrating a capability not inherent to Mz type atomic magnetometers nor single NV centers.

Single-Channel Frequency-Locking

Figure 11:
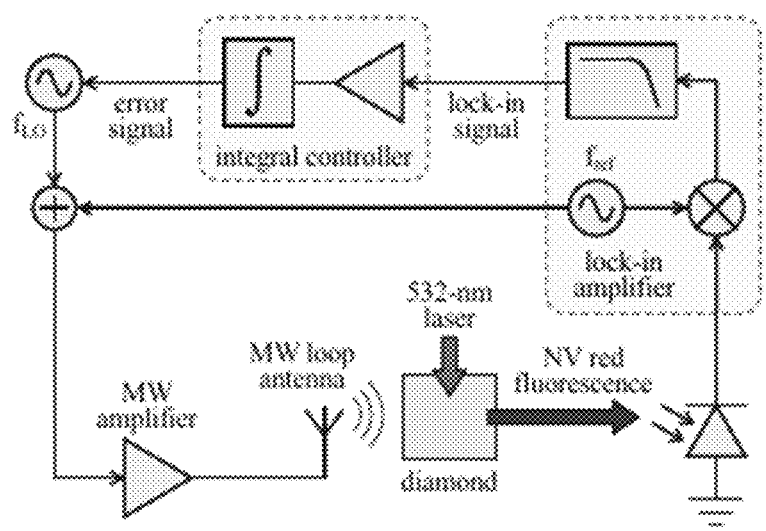
FIG. 11 shows an example signal path for a single-frequency locked loop.

First, we describe the technique as it applies to a single NV resonance and address advantages as well as extensions that yield further operational improvements. In later sections, we discuss extensions of the technique and associated benefits thereof. FIG. 11 shows a diagram of the signal path of a frequency locked loop for a single NV resonance. A signal generator outputs a microwave signal frequency, $f_{LO}$, which is tuned to minimize the error on the feedback compensator. The microwave signal is modulated at frequency $f_{ref}$ with depth $f_{dev}$ to produce a time-dependent frequency given by:

$$f_{mod}(t) = f_{LO} + f_{dev} \cos(2\pi f_{ref} t) \quad (3)$$

While $f_{LO}$ is set to minimize the error signal and $f_{dev}$ is chosen to maximize the responsivity of the NV system (that is, how much the lock-in signal changes given a small shift in the NV resonance frequency), there are some additional considerations that go into the selection of an appropriate $f_{ref}$; these considerations will be elaborated upon shortly. The signal is sent to an antenna which drives the NV spin with the modulated microwave field. The fluorescence signal from the diamond sample is detected with a photodetector and demodulated by a lock-in amplifier.

One can set the phase of the lock-in amplifier such that the in-phase component of the lock-in signal is positive (negative) if $f_{LO}$ is slightly below (above) the NV transition frequency, whereas the lock-in signal is zero when $f_{LO}$ is directly on resonance with the NV transition frequency [see FIG. 12]. Note that optimum choice of phase can maximize the responsivity of the NV lock-in signal to shifts in the NV resonance (thereby improving magnetic sensitivity); however different phase settings may be optimum for different situations. A feedback compensator, which may include a proportional-integral-derivative (PID) controller, produces an error signal from the lock-in signal. The error signal in turn provides feedback to adjust the microwave source frequency $f_{LO}$ and lock it to the center of the NV resonance.

The dynamics of the feedback loop can be analyzed using a linear approximation of the system. For example, the fluorescence amplitude as a function of time can be described by approximating the Lorentzian-shaped NV resonance as a quadratic polynomial (valid for $f_{LO}-f_0 < \sigma \approx 500$ kHz):

$$V_{f1} = V_0 \left(1 - \frac{c}{1 + \left(\frac{f_{mod} - f_0}{\sigma}\right)^2}\right) \quad (4)$$

$$\approx V_0 \left(1 - C + \frac{2C}{\sigma^2}(f_{mod} - f_0)^2\right)$$

where C is the contrast, $f_0$ is the resonant frequency, and $\sigma$ is half of the full-width half-maximum (FWHM) of the Lorentzian. This response translates the frequency modulation of the microwaves to an amplitude modulation of the fluorescence signal.

The output of the lock-in amplifier is the fluorescence signal mixed with the reference ($f_{ref}$) and low-pass filtered:

$$V_{out}(f) = V_{f1}(f) * \frac{\delta(f - f_{ref}) + \delta(f + f_{ref})}{2} H(f) \quad (5)$$

where H(f) is the transfer function of the digital low pass filter.

Combining equations (4) and (5) results in a sum of sinusoids at different harmonics of f_ref convolved with the low-pass filter response. The cutoff frequency of the filter can be set at a much lower frequency (e.g., 160 Hz) than the reference frequency so that the contribution from most or all terms except those mixed down to DC are filtered out, resulting in the approximate output:

$$V_{out}(f) = \frac{2CV_0}{\sigma^2} f_{dev} [f_{LO}(f) - f_0(f)] H(f) \quad (6)$$

In the case of a closed-loop system such as the one employed with the frequency-locking technique, the error (i.e., the lock-in signal) set by $[f_{LO}(f)-f_0(f)]$ is kept small. Consequently, operation of the presented magnetometer can be modeled as a linearized dynamical system. The system dynamics can be analyzed using a simple control architecture, such as that depicted in FIG. 4B. The model system 450 includes a stage 452 described Plant transfer function G(z) and a controller 454 that is shown as a digital integral controller in this particular example system, but may generally include proportional, integral, and/or derivative gain parameters.

The first stage 452 in the control architecture diagram includes an amplification stage 458 of the frequency error $[f_{LO}(f)-f_0(f)]$ signal by the responsivity of the NV system, approximated to be linear as we have discussed, followed by a low-pass filter stage 456, such as the one discussed above. Mathematically, this stage is described by a Plant transfer function $$G(z) = \frac{2CV_0}{\sigma^2} f_{dev} H(z), \quad (7)$$

where H(z) is the transfer function of the low pass filter 456. In this example analysis of this example system, we use a digital first order IIR filter such that $$H(z) = \frac{\alpha z}{z + \alpha - 1},$$

where $$\alpha = 2\pi(f_c/f_s) \Big/ \left[2\pi\left(\frac{f_c}{f_s}\right) + 1\right], f_s$$

is the sampling frequency, and $f_c$ is the filter cut-off frequency. Note however that in general any implementation of a low pass filter can be employed.

The Plant transfer function is then given (in this model case) by:

$$G(z) = \frac{2CV_0}{\sigma^2} f_{dev} \frac{\alpha z}{z + \alpha - 1} \quad (8)$$

From the above equation, we can see that when this system is applied to open-loop measurements, the gain is proportional to a number of experimental parameters: signal contrast (C), fluorescence intensity ($V_0$), and resonance linewidth ($\sigma$). These parameters are susceptible to fluctuations in both laser intensity and microwave power, which degrade the accuracy of the open-loop sensor.

The addition of a feedback loop allows for tracking the frequency of the resonance without this dependence on non-fundamental experimental parameters. In this example analysis, we implement the feedback loop via a digital integral controller 454, with open loop transfer function given by:

$$C(az) = \frac{K_I z}{z - 1} \quad (9)$$

Note however that the feedback loop controller may be implemented more generally, e.g., to include proportional, integral, and/or derivative gain parameters. The open loop transfer function is then:

$$L(z) = G(z)C(z) = \frac{2CV_0}{\sigma^2}f_{dev}K_I\frac{\alpha z}{z+\alpha-1}\frac{z}{z-1}, \quad (10)$$

and the closed loop transfer function from $$F_0(z) \text{ to } F_{LO}(z) \text{ is } T(z) = \frac{L(z)}{1+L(z)}.$$

Note that a simple integrator controller increases the open-loop DC gain to eliminate steady-state error. From Eq. (10), the open loop gain can be increased in multiple ways: through an increase in contrast (C), fluorescence amplitude ($V_0$), or integrator gain ($K_I$), a decrease in linewidth ($\sigma$); or a combination thereof (note that increasing $f_{dev}$ by too much would break the original condition for the validity of this linear approximation). However, different implementations of the feedback controller will yield different advantages and disadvantages and may be tailored for specific applications.

In this example of employing a digital integrator controller with gain $K_I$, the resulting closed loop transfer function is given by $$T(z) = \frac{G(z)C(z)}{1+G(z)C(z)}, \quad (11)$$

For large gain values, the closed loop transfer function is approximately independent of experimental parameters and is thus robust against laser and microwave intensity noise. Furthermore, invoking the final value theorem with a step input, the previous equation can be shown to have no steady-state error. The closed loop system accurately tracks the resonant frequency in steady-state, and only the dynamics of the transient response are influenced by non-fundamental experimental parameters.

While a scale-factor-free measurement of the magnetic field tied only to fundamental constants and subsequently immune to technical noise, such as laser intensity and microwave power fluctuations, is one of the major advantages of the frequency-locking technique described here, there are a number of additional advantages to the technique. Fast feedback capability allows for rapid, real-time measurements, limited only by the lock-in filtering and frequency-locking response time. The magnetic sensitivity of this technique is as good as or better than that of other NV ODMR techniques, containing inherently no measurement dead time and being generally limited by the shot noise limit indicated in Equation (2) but ultimately potentially by the spin projection limit. Furthermore, by virtue of locking to the NV resonance frequency, the measurement is always performed in the approximately linear regime of the lock-in signal, not only making it possible to access the full dynamic range of the NV system (compared to previous open-loop techniques) but additionally enabling maximal sensitivity over the full dynamic range of the NV center.

Note that the full dynamic range inherent to the NV center spans from zero external field to >1 tesla. There are some technical considerations regarding fluorescence suppression due to spin state level mixing at particular field strengths related to when certain energy levels would cross each other; however, these issues may be overcome, for example, by taking advantage of the over-determined system to use information from different NV orientation classes or even by methods of non-fluorescent readout. The overdetermined system and information from other NV orientation classes can also help overcome potential ambiguities where individual NV resonances cross and/or are degenerate at crossover points. Consequently, the dynamic range of an NV magnetometer employing the frequency-locking technique may reach the full >1 tesla dynamic range inherent to the NV system.

As mentioned above, there are some technical considerations involved in the section of the modulation frequency $f_{ref}$. One consideration is the noise due to various technical components of the measurement apparatus; in particular, the laser and other electronic systems have unavoidable 1/f noise. Modulating at frequencies where this noise is dominant increases the noise floor of the measurement beyond the fundamental shot-noise limit and subsequently reduces the sensitivity of the measurement [See FIG. 13]. For this reason, modulation frequencies above the 1/f corner are preferred.

Another consideration is the response of the spin system to the changing microwave frequency. The NV center has finite response time to MW drive modulation, resulting in reduced responsivity at higher modulation frequencies [see FIG. 14]. Responsivity here is essentially how much the lock-in signal changes in response to a given small change in the NV resonance frequency. The degree of this finite response time effect is somewhat dependent on optical excitation power and can be mitigated by increasing the optical power. However, this effect makes lower modulation frequencies preferential.

Dividing the noise from the first consideration mentioned by the responsivity from the second consideration and then dividing by the NV gyromagnetic ratio $\gamma$=28.0249 Hz/nT gives the magnetic sensitivity expected from taking both considerations into account [see FIG. 15]. As a result, there is typically a limited range of optimum modulation frequencies; the upper and lower limits of this optimum modulation frequency range can be affected by choice of low 1/f noise electronics and/or higher laser power, but it typically spans from several kHz to 10-20 kHz.

Figure 10A:
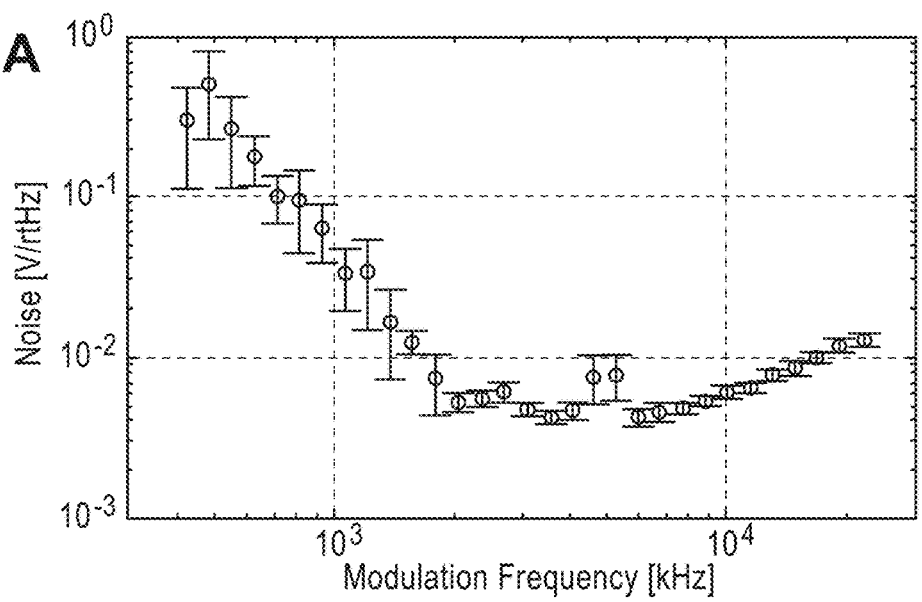
FIG. 10A shows a plot of noise measurements as a function of modulation frequency of an example magnetometer system.
Figure 10B:
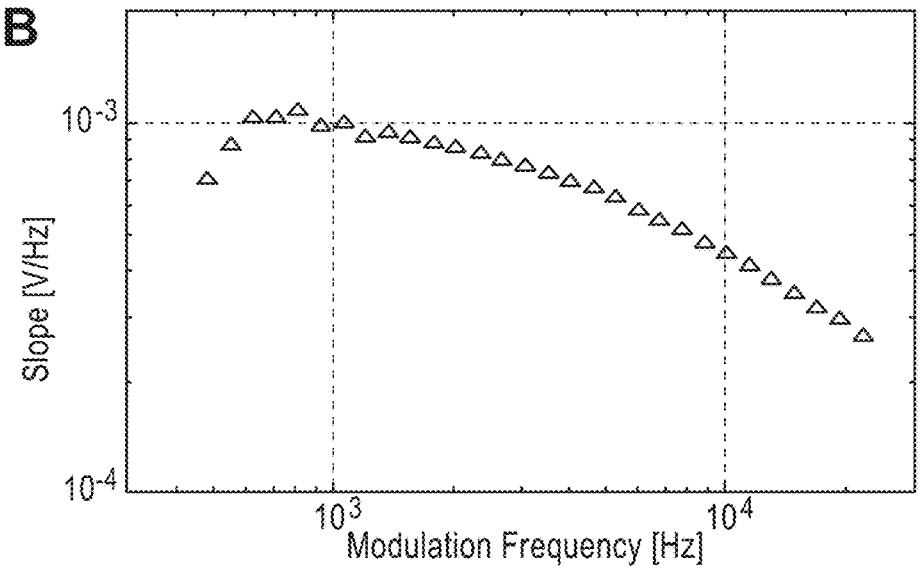
FIG. 10B shows an example of the responsivity of the NV system to noise as a function of modulation frequency of an example magnetometer apparatus.
Figure 10C:
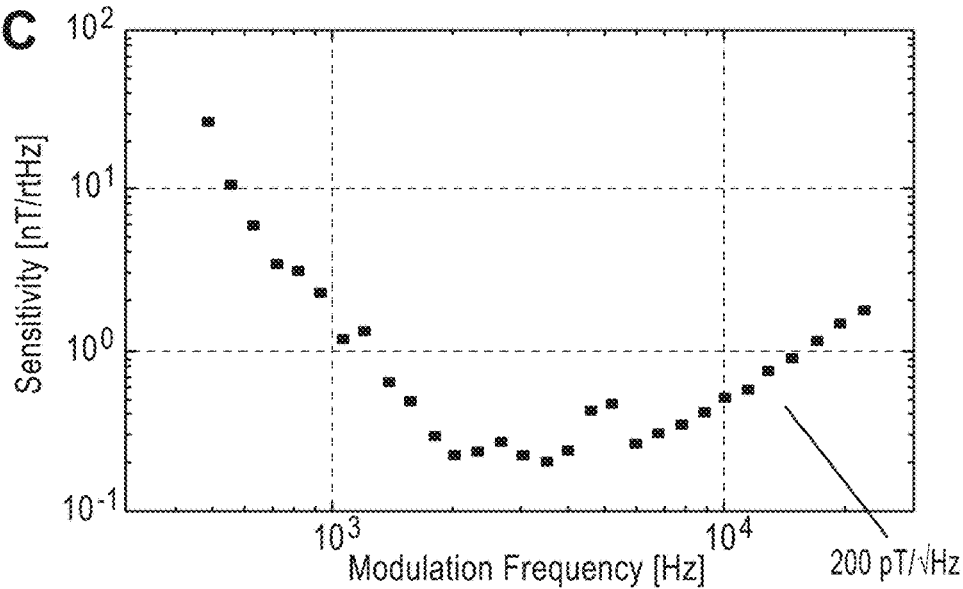
FIG. 10C shows an example plot of sensitivity to noise as a function of modulation frequency of an example magnetometer system, indicating an optimum subset of modulation frequencies for operation.

FIGS. 10A-10C provide an additional example of performance of the NV system under varying modulation frequencies. Note that the plot of noise as a function of modulation frequency shown in FIG. 10A has high frequency noise~6 kHz in addition to the expected 1/f noise. Note how the noise in FIG. 10A propagates to the plot of expected sensitivity as a function of modulation frequency in FIG. 10C, consequently limiting the range of modulation frequencies for optimum sensitivity. This second example illustrates the importance of minimizing technical noise to allow for greater flexibility in choice of modulation frequency; this will become especially relevant for techniques described later involving simultaneous driving of multiple frequency-locking channels.

In addition to the inherent advantages and technical details of the frequency-locking technique discussed thus far, there are several optional operational modes that provide further improvements, e.g., to magnetic sensitivity, that we wish to expand upon here, before discussing extending the technique to multiple NV resonances.

First, as mentioned during the discussion of the NV hyperfine structure, while the most common isotope of nitrogen is $^{14}$N (nuclear spin I=1) at 99.6% natural abundance, diamond is also commonly synthesized with $^{15}$N (nuclear spin I=½). Due to hyperfine interactions between the NV electronic spin and the nuclear spin of the nitrogen atom in the NV, each NV resonance may have either three hyperfine transitions ($^{14}$N) or two hyperfine transitions ($^{15}$N). Examples of these two cases for an NV ensemble are shown in the ODMR spectra given in FIG. 16, with $^{15}$N shown on the top spectrum and $^{14}$N shown on the bottom spectrum.

Under typical ambient conditions, the hyperfine states are roughly equally populated; that is, for an NV containing the $^{15}$N isotope, half of the population is in one hyperfine state and half is in the other, and for an NV containing the $^{14}$N isotope, ⅓ of the population is in each of the three hyperfine states. Consequently, the contrast of a single hyperfine transition of an NV containing the $^{15}$N isotope is approximately 50% higher than the contrast of a single hyperfine transition of an NV containing the $^{14}$N isotope. Recall that contrast (denoted by a in the sensitivity equation given in the NV section above) is linearly related to the magnetic sensitivity, which means that the sensitivity of $^{15}$N-containing NV centers is 50% better than that of $^{14}$N-containing NV centers, in the simplest operating mode where the frequency-locking technique is applied to a single hyperfine transition of a single NV resonance frequency.

A second advanced technique involves mixing the modulated MW drive with an additional signal whose frequency is equal to that of the NV hyperfine splitting, thus producing sidebands that coincide with the other one or two hyperfine transitions of the addressed NV resonances. In this way, all hyperfine transitions can be driven, rather than one, improving the responsivity of the NV system greatly. This is illustrated, for example, on a $^{14}$N-containing NV resonance in FIG. 16.

Note that incorporating this sideband modulation technique and driving all hyperfine transitions can recoup the contrast (and subsequent sensitivity) loss due to driving one of three hyperfine transitions of $^{14}$NV compared to one of two hyperfine transitions of $^{15}$NV discussed above. The equalization of the sensitivities of the different nitrogen isotopes allows $^{14}$NV to be employed in situations where it is preferable without a loss in sensitivity. In particular, $^{14}$NV has a strong quadrupolar moment that may be useful for certain measurement modalities, and the $^{14}$N isotope is more naturally abundant and often cheaper to incorporate into diamond.

In the next four sections, we will expand on the inventiveness of performing the frequency-locking technique discussed here on multiple transitions of an NV ensemble. Doing so has not been previously demonstrated and is used for measuring the full magnetic vector and decoupling these magnetic measurements from temperature fluctuations and other technical noise.

Simultaneous 2-Channel Frequency-Locking

Recall that the behavior of the NV resonance frequencies in the presence of magnetic fields, electric fields, and strain is described by the NV ground-state Hamiltonian below:

$$H_{gs} = (hD_{gs} + d^\shortparallel_{gs}\Pi_g)\left[S_g^2 - \frac{1}{3}S(S+1)\right] + \mu_B g_e S \cdot B - d^\perp_{gs}[\Pi_x(S_x S_y + S_y S_x) + \Pi_y(S_x^2 - S_y^2)] \quad (12)$$

where the ($\Pi_X$, $\Pi_Y$, $\Pi_Z$) terms correspond to electric field and strain. An NV-diamond system employed as a magnetometer can be configured to be negligibly sensitive to electric fields, e.g., with the application of a magnetic field with non-zero projection along the NV symmetry axis. Also, in the course of typical operation, the strain of the diamond host does not change. Consequently, we typically neglect the electric field and strain terms of the Hamiltonian for an NV-diamond system operating as a magnetometer.

The simplified Hamiltonian is then:

$$H_{gs} = h\,D_{gs}[S_Z^2 - (S/3)(S+1)] + \mu_B g_e S \bullet B \quad (13)$$

In the limit where the magnetic field is mostly aligned to the NV symmetry axis, the Hamiltonian can be approximated as follows:

$$H_{gs} \approx h\,D_{gs}[S_Z^2 - (S/3)(S+1)] + \mu_B g_e B_Z S_Z \quad (14)$$

However, the zero-field splitting $D_{gs}$ varies with temperature with linear dependence near room temperature (at minimum over the temperature range of 280K-330K), given approximately by $$D_{gs} \approx D_{gs}(T=0K) + \beta_\gamma \Delta T \quad (15)$$

where $D_{gs} \approx 2.87$ GHz is the zero field splitting at 300 K, $\beta_\gamma \approx -74$ kHz/K near room temperature, and $\Delta T$ is the temperature offset from 300 K during the measurement.

From this approximation and subsequent analysis, we see that the NV ground-state energy levels and thus the NV resonance frequencies are dependent on both magnetic field and temperature. In particular, the magnetic field mostly increases the splitting between the two NV resonances, while the temperature globally shifts both resonances either up or down. Because of these interrelated effects, knowledge of one NV resonance frequency is not sufficient information to accurately extract the magnetic field, even in the simple axial magnetic field approximation. Instead, this case of a single NV orientation class in an approximately axial magnetic field uses knowledge of both the upper and lower NV resonance frequencies.

The basic, single-channel frequency-locking technique described in the previous section can be extended by adding a second channel to measure a second NV resonance in a manner that is generally straightforward. The second channel is centered around a carrier frequency $f_{LO,2}$ set to the chosen hyperfine transition of the NV resonance to minimize the error signal. The second channel is modulated at a distinct modulation frequency $f_{ref,2} \neq f_{ref,1}$ and the NV fluorescence signal is demodulated at that same frequency, yielding independent lock-in signals for the two NV resonances from a single optical measurement. In this way, adding a second channel requires no additional hardware or measurement time and involves minimal additional processing overhead. However, note that due to the shared optical readout channel, simultaneously driving multiple NV resonances may require more complicated demodulation and filtering to avoid crosstalk between the multiple modulation frequencies. Furthermore, the response bandwidth and responsivity (related to sensitivity) of a given channel degrades at modulation frequencies outside of the optimal sensitivity range discussed in the previous section. Consequently, the modulation frequencies should not be chosen to be arbitrarily far apart in order to reduce crosstalk; instead, it is important to choose a second modulation frequency that is far enough away from the first modulation frequency to avoid unintended cross-talk and intermodulation interference, while making sure both modulation frequencies are still in the range for optimal sensitivity.

Note that driving two transitions that both involve the same spin state can result in depopulation and first order coherent driving effects, which affect the lineshape deleteriously. This undesired effect can be avoided by driving different hyperfine transitions in the lower resonance compared to the upper resonances; due to the 2+ hyperfine transitions inherent to the NV regardless of nitrogen isotope, this solution is always possible. One example possibility for driving different hyperfine transitions of the upper and lower NV resonances is shown in FIG. 17, with the solid lines in the lower resonances corresponding to $m_S=0 \rightarrow -1$ indicating the $m_I=-1$ hyperfine state and the dashed lines in the upper resonances corresponding to $m_S=0 \rightarrow +1$ indicating the $m_I=0$ hyperfine state. Note that this method may not be compatible with the sideband modulation technique discussed previously, since the sideband technique drives all hyperfine transitions of an NV resonance.

Additionally, while measurement of both upper and lower resonances has been demonstrated previously on a single NV center by switching a single-channel frequency-locking implementation between the two resonances, the non-simultaneity of the measurement introduces systematic error for temperature and magnetic field variations that are not significantly slower than the switching frequency. Furthermore, the switching frequency introduces noise that degrades the sensitivity of the magnetometer with a 1/f characteristic.

Employing the generally straightforward extension described in this section to the basic frequency-locking technique allows for the simultaneous measurement of the upper and lower resonances of a single NV orientation class with minimal additional hardware and processing overhead, and is appropriate for accurately decoupling measurements of magnetic field from temperature fluctuations over all timescales, as well as from technical noise as afforded by the frequency-locking technique in general. Making magnetic field measurements independent of temperature further allows for a more robust sensor that has no need for temperature control.

Sequential Vector Magnetometry Via Simultaneous 2-Channel Frequency-Locking

As discussed in the previous section, simultaneous measurement of the upper and lower resonances of a single NV orientation class allows the local magnetic field and temperature experienced by the NV ensemble to be decoupled. However, for a single NV orientation classes, this decoupling is most effective in the regime where either the alignment of the magnetic field with respect to the NV symmetry axis or the magnetic field magnitude is known. Outside of this condition, the magnetic field vector (comprising magnitude and direction information) and temperature are once again coupled. FIGS. 18A and 18B illustrate how, for a pair of measured resonance frequencies, the assumption of different temperatures yields different extracted values for the angle θ between the magnetic field vector and the NV symmetry axis and magnetic field magnitude. Mathematically, this problem makes intuitive sense, as there are three unknowns and only two knowns. Thus, the temperature and the full vector information of an arbitrary magnetic cannot be generally extracted from a single NV orientation class.

An NV ensemble in bulk diamond, however, naturally includes four NV orientation classes, with symmetry axes along four well-known, stable directions. In the presence of a magnetic field in an arbitrary direction, the four orientation classes will correspond to four different pairs of resonance frequencies, with several important characteristics: (1) the temperature affects each NV orientation class the same, thus shifting the zero-field splitting by the same amount; (2) each NV orientation class will experience the same magnetic field magnitude but, generally, different axial and transverse components of the field with respect to the individual NV axes; and (3) the symmetry axes corresponding to each NV orientation class are known with respect to each other and set by the inherent, stable diamond lattice. As a result, performing measurements on multiple NV orientation classes, naturally occurring in a large NV ensemble, allows for the full extraction of the full magnetic field vector, decoupled from temperature effects, for a general magnetic field orientation.

One approach to performing measurements on multiple NV orientation classes is a simple extension of the simultaneous 2-resonance frequency-locking technique described in the previous section: specifically, simultaneously locking to the upper and lower resonances of a single NV orientation class at a time and rapidly cycling through multiple NV classes. To implement this sequential vector magnetometry approach, one could (1) first perform an ODMR sweep to locate the positions of all 8 NV resonances; (2) apply the dual-channel simultaneous frequency-locking technique on the upper and lower resonances of one NV orientation class for a short sampling period; (3) using the same dual-channel implementation, change the MW drive frequencies to lock to the upper and lower resonances of a second NV orientation class for a short sampling period, (4) using the same dual-channel implementation, change the MW drive frequencies to lock to the upper and lower resonances of a third NV orientation class for a short sampling period; (5) optionally, using the same dual-channel implementation, change the MW drive frequencies to lock to the upper and lower resonances of the fourth NV orientation class for a short sampling period; before finally (6) returning to the first NV orientation class.

Using this process, we can rapidly cycle between all four (or alternatively a subset of three) NV orientation classes to extract information on the magnetic field magnitude and orientation with respect to each of the chosen NV orientation class symmetry axes. Then, using the known relative orientation of the symmetry axes with respect to each other, the full magnetic field vector can be reconstructed and transformed into a 3-axis Cartesian coordinate frame. Mathematically, this technique can be understood intuitively as measuring 6 or 8 knowns (i.e., NV resonance frequencies) in order to extract 4 unknowns (temperature and three components of the magnetic field vector). In particular, only three of the NV orientation classes can be used to fully reconstruct the full magnetic field vector in the 3-axis Cartesian coordinate frame, and for certain applications, it may be preferable to increase the overall cycling frequency by only sampling three of the four NV orientation classes.

However, the tetrahedral geometry of the diamond crystal lattice (and consequently the NV-based magnetometer's inherent coordinate frame) is an optimally overdetermined system that affords a number of useful advantages for vector magnetic sensing, both in measurement accuracy and sensitivity. In particular, with extra information about the magnetic field, one can apply different weights to determine how much certain information (e.g., individual resonance frequencies or orientation classes) contribute to the calculation of the magnetic field vector and temperature, in order to, e.g., significantly enhance the sensitivity of the magnetic measurement. Using real-time processing these weights can be constantly updated to keep the NV magnetometer in its optimal sensitivity regime.

Note that there is also the option of cycling between 3 NV orientation classes and real-time updating which NV orientation classes to employ in the measurement for optimized sensitivity, as a way to take advantage of the faster cycling time of the 3-NV-class process while optimizing the sensitivity by choice of "weighting" similar to the 4-NV-class process. Regardless of the specific approach, this technique has the major advantage of allowing for the full reconstruction of the magnetic field vector, decoupled from temperature and other technical noise as afforded by the basic frequency-locking technique. Furthermore, there is almost no additional overhead in hardware or technical complexity compared to the basic simultaneous dual-channel frequency-locking technique described in the previous section.

As a trade-off for the minimal increase in technical complexity, this sequential vector magnetometry technique may experience the same limitations as discussed previously in the case of sequential measurements of the upper and lower resonance frequencies of a single NV orientation class: changes in the magnetic field and/or temperature that are faster than the rate of cycling between measurements of different NV orientation classes can result in a systematic error in the extracted magnetic field and temperature values and may increase the noise floor of the magnetic sensitivity in a 1/f fashion. However, many systematic effects may be mitigated by continuously randomizing the order and sampling time of the measurements on the different NV orientation classes.

Simultaneous Vector Magnetometry Via Simultaneous 8-Channel Frequency-Locking

Another approach to performing measurements on multiple NV orientation classes that overcomes the systematics of the sequential measurement is another simple extension of the simultaneous 2-resonance frequency-locking technique to a simultaneous 8-resonance frequency-locking. In this case, much as we did for the simultaneous dual-channel case, n channels can be added to measure an n-th NV resonance in a manner that is generally straightforward. The n-th channel is centered around a carrier frequency $f_{LO,n}$ set to the chosen hyperfine transition of the NV resonance to minimize the error signal. The n-th channel is modulated at a distinct modulation frequency $f_{ref,n}$ that is not equal to the modulation frequency of any other channel, and the NV fluorescence signal is demodulated at that same frequency, yielding independent lock-in signals for the n NV resonances from a single optical measurement. In this way, adding n channels requires no additional hardware or measurement time and involves minimal additional processing overhead. Note that there is now additional technical complexity in that it is important to choose now n modulation frequencies that are far enough away from the other modulation frequencies to avoid unintended cross-talk and inconveniently located intermodulation distortions, while making sure all modulation frequencies are still in the range for optimal sensitivity. Alternatively, the modulation frequencies of some channels may be chosen to be slightly outside the range for optimal sensitivity, thereby trading off better trade-off for reducing cross-talk effects between the channels.

To implement this simultaneous vector magnetometry approach, one could first perform an ODMR sweep to locate the positions of all 8 NV resonances, and then apply the n-channel frequency-locking implementation to lock to the upper and lower resonances of either 4 NV orientation classes, or 3 NV orientation classes. The benefits to one or the other are similar to those described in the previous section; here, the 3-NV-class (6-channel) implementation is technically simpler while the 4-NV-class (8-channel) implementation may afford better sensitivity. Again, as in the previous section, one could implement the 3-NV-class (6-channel) implementation and real-time update the measured NV orientation classes during the course of the measurement to optimize sensitivity.

This 6- or 8-channel simultaneous frequency-locking technique has several major advantages over the other techniques discussed thus far; the simultaneous measurements of all resonances allows for the full and accurate reconstruction of the magnetic field vector, decoupled from temperature effects, and immune to technical noise as afforded by the basic frequency locking technique. This technique overcomes the systematic errors due to magnetic fields and temperatures changing on timescales that are comparable to the sequential cycling rate, inherent to sequential measurements. As a magnetic vector sensor that is robust against noise due to movement and vibration in an ambient magnetic field, the NV-diamond based vector magnetic sensor is quite well-suited for application on mobile platforms which may move and rotate in the presence of an ambient magnetic field. Furthermore, the simultaneous measurements provide an additional enhancement to the magnetic sensitivity by as much as a factor of 2, by virtue of the fact that measurement duty cycle of each individual NV orientation class increases from 25% (4-NV) or 33% (3-NV) in the sequential vector measurement case to 100% in the simultaneous case discussed here.

Simultaneous Vector Magnetometry Via Simultaneous 4-Channel Frequency-Locking

Another approach to performing measurements on multiple NV orientation classes that both overcomes the systematics of the sequential measurement and reduces the technical complexity compared to that of the simultaneous 6- or 8-channel implementation is to perform simultaneous frequency-locking measurements on a subset of 4 of the possible 8 NV resonances. Under most magnetic field configurations, measurement of 4 NV resonances is sufficient information to fully extract the full magnetic field vector and temperature. Mathematically, this approach can be understood intuitively as measuring 4 knowns (i.e., NV resonance frequencies) in order to extract 4 unknowns (temperature and three components of the magnetic field vector).

For verification, we numerically solved the NV ensemble Hamiltonian under varying conditions of magnetic field strength, magnetic field orientation, temperature, NV resonance linewidth (related to $T_2^*$ which in turn affects the magnetic sensitivity), and how many and which NV resonances are used to reconstruct the magnetic field and temperature. From this numerical analysis, we confirmed that with appropriate choice of 4 NV resonances, the full magnetic field vector and temperature can be extracted with minimal reduction in sensitivity compared to using 8 NV resonances in the vector reconstruction. As one example, at a given magnetic field orientation A, the four NV resonances corresponding to the lowest, $2^{nd}$ lowest, $3^{rd}$ highest, and $4^{th}$ highest transition frequencies may yield the best magnetic sensitivity, while at a different magnetic field orientation B, the four NV resonances corresponding to the lowest, $2^{nd}$ lowest, highest, and $2^{nd}$ highest transition frequencies may yield the best magnetic sensitivity. Similar to the techniques described in the previous sections, a possible implementation of an NV magnetometer may perform real-time processing to reconstruct the measured magnetic field, evaluate what subset of four NV resonances will yield the most sensitive measurement of the current orientation of the magnetic field, and update the device to perform measurements using these optimized NV resonances.

This simultaneous 4-channel measurement technique has a clear advantage over the simultaneous 8-channel measurement technique presented in the previous section in terms of reduced technical complexity. Specifically, in the simultaneous 4-channel technique, 4 simultaneous modulation frequencies are employed, allowing for greater separation between the modulation frequencies in order to reduce cross-talk between the channels, while at the same time allowing all four modulation frequencies to be chosen from within a frequency range that optimizes the magnetic sensitivity.

Flexibility in determining which NV resonances to employ in the measurement is another advantage that eases the technical complexity of the NV magnetic sensor implementation compared to the simultaneous 8-channel measurement approach. Specifically, while a particular subset of NV resonances may provide the most sensitive measurement for a given magnetic field orientation, the NV resonances employed in the measurement may be set by other constraints: the bandwidth of a MW component used for a specific application may limit the accessible NV resonances to, e.g., those with the four highest transition frequencies. The simultaneous 4-channel measurement technique has the flexibility to trade off optimum sensitivity for other technical constraints and may thus be employed in situations and for applications not accessible to the other techniques.

One specific technical consideration is that employing 4 NV resonances that correspond to 4 different NV orientation classes is directly compatible with the sideband modulation technique described in the section describing the basic frequency locking technique. That is, driving one resonance (either the upper or the lower) of each NV class allows one to perform sideband modulation to drive all hyperfine transitions without concern for the depopulation or first order coherent driving effects that emerge when both upper and lower resonances of a single NV orientation class are driven. This sideband modulation technique can be applied to all four NV resonances (provided that they each correspond to a unique NV orientation class) to significantly improve the responsivity of the NV system and thus the magnetic sensitivity of the device.

Note that in addition to the advantages listed previously in this section, the simultaneous 4-channel frequency-locking technique shares many of the same benefits of the simultaneous 8-channel frequency-locking technique. First, simultaneous vector measurements using multiple NV resonances improves the magnetic sensitivity compared to sequential vector measurements by eliminating dead time on measurements of individual NV resonances, such that each addressed NV resonance has a measurement duty cycle of 100%. Second, simultaneous measurements avoid the systematic errors and 1/f noise that are introduced when a sequence of non-coincident measurements are taken on different NV resonances. As mentioned previously, the simultaneous 4-channel frequency-locking technique yields a slightly degraded magnetic sensitivity compared to the simultaneous 8-channel frequency-locking measurement and may require slightly higher real-time processing overhead. Note however, the relative advantages of each technique may be balanced and tailored to specific applications by employing anywhere from a minimum of 4 NV resonances simultaneously to a maximum of 8 NV resonances simultaneously.

Figure 3:
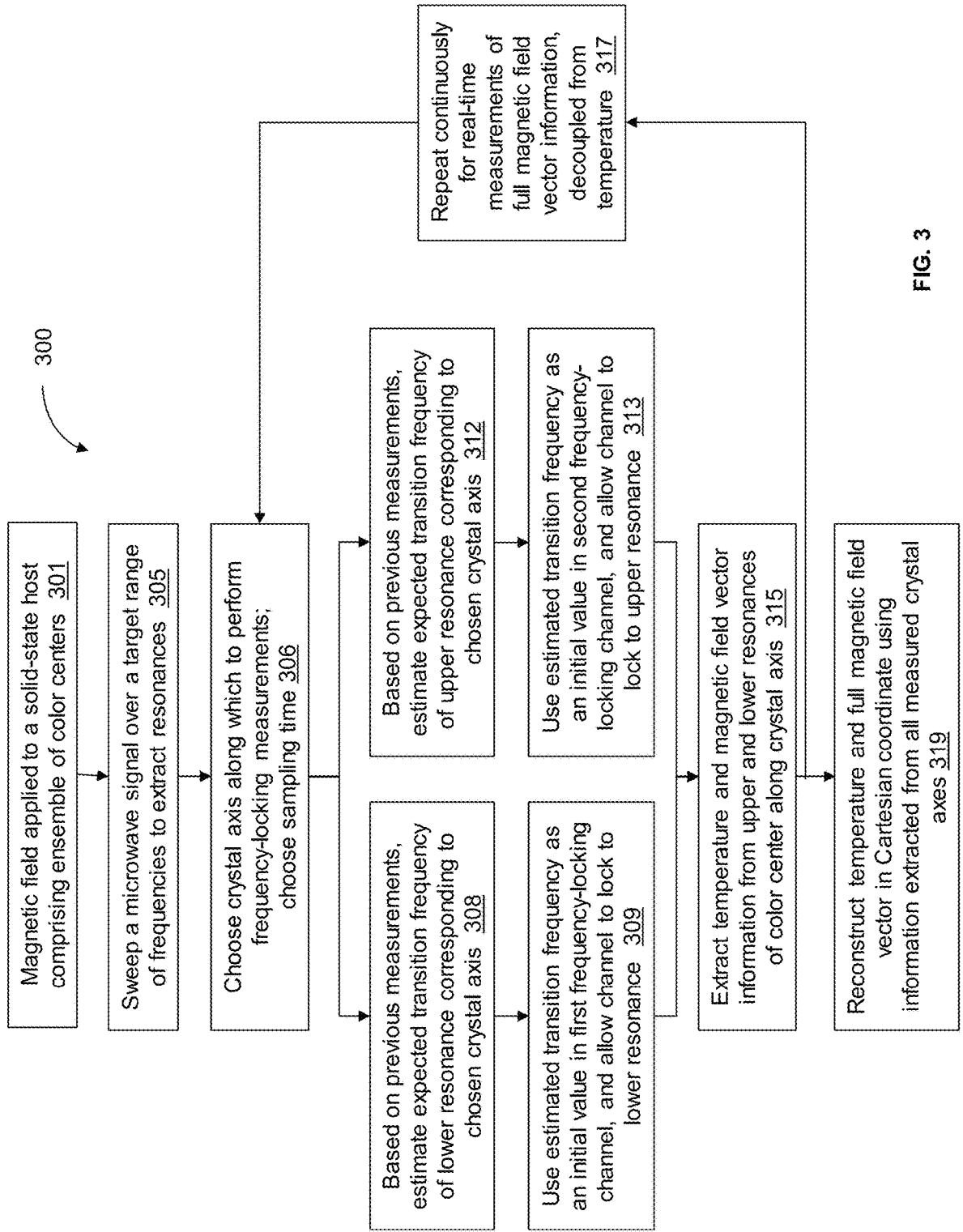
FIG. 3 shows an example method of measuring magnetic fields using a sequential vector magnetometer based on the spin states of an ensemble of solid-state defects.

Example Concepts for Magnetometer Systems
Process Diagram of an Example NV-Diamond Sequential Vector Magnetometer System FIG. 3 illustrates a process 300 for NV magnetometry using frequency locking. Briefly, as shown in the flow path of process 300 in FIG. 3, the crystal host containing color centers (e.g., NV centers) are first exposed to the magnetic field to be measured in step 301. This magnetic field can be an external field of unknown or known magnitude and direction or a magnetic field internal to the crystal host. The step 301 of process 300 includes other methods of introduction of the magnetic field to the sensing magnetometer under other instances when the magnetic field may not be explicitly or actively applied to a crystal host containing color centers, for example, when the magnetic field is intrinsic to a material containing the crystal host. (From an NV's perspective, there may be no perceptible difference between these two situations.)

Suitable optical excitation and optical detection systems excite and/or detect fluorescence emitted by the color centers. Appropriate frequency locking systems use the emitted optical signal to locate the NV resonance frequency arising from driven state transitions and lock to that frequency in a closed-loop manner as explained in detail previously. As a brief review, however, an ensemble of NV centers in the crystal host can be excited by incident light, for example, a laser light source at a wavelength of 532 nm. The photoluminescence emitted by the crystal can be modulated by modulating the microwave drive of an NV resonance at a given modulation frequency. This photoluminescence signal can be focused by a suitable optical system onto an optical detector, which transduces the photoluminescence into an electrical signal (e.g., a photocurrent or voltage whose amplitude varies with the intensity of the photoluminescence) that can be demodulated at the modulation frequency to produce an error signal. Using the error signal as input to a feedback controller that adjusts the microwave drive frequency to minimize the error signal allows the microwave drive frequency to be locked to a chosen NV resonance.

For optimal effectiveness of the frequency-locking technique, having reasonable initial values for the NV resonance frequencies can be important. These initial values can be extracted in step 305: the crystal host with the applied magnetic field is subjected to microwave (MW) radiation swept in a target range of frequencies that encompasses the frequencies of NV resonances expected to be generated in the diamond host. For example, the microwave source can be swept from about 2.65 GHz to about 3.1 GHz encompasses all NV resonance frequencies in the case where the applied magnetic field magnitude is less than or equal to 80 Gauss. The step 305 can be an initialization step carried out once in the beginning of process 300 and used to extract initial values for all 8 NV resonances corresponding to all 4 NV orientation classes.

In step 306 of this process, one of the four possible crystal axes may be chosen for the next set of simultaneous frequency-locking measurements of upper and lower resonance. For certain implementations of this technique, the period of time that the chosen crystal axes is sampled may be changed or kept fixed.

Steps 308-309 and 312-313 are performed simultaneously and correspond to measurements on the lower and upper resonances, respectively. Specifically, an initial value for the lower resonance frequency is estimated in Step 308; this initial value may be the last measured value of the lower resonance frequency of the chosen crystal axis or may be extrapolated from the last n measured values of the lower resonance of the chosen crystal axis or may be extracted from the most recent or last n reconstructions of the total magnetic field vector, for example. Different algorithms for estimating an initial value for the lower resonance may be appropriate for different situations depending on considerations of, e.g., processing speed and/or accuracy of the initial estimate. Step 312 is the analog of Step 308, but addresses the upper resonance of the crystal axis.

Recall from previous discussion that due to possible depopulation and first order coherent driving effects, it is typically preferable to avoid driving the same hyperfine transition in both upper and lower resonances. Consequentially, for example, one may drive the $|m_s, m_I>=|0,-1>\rightarrow|-1,-1>$ hyperfine transition of the lower resonance and the $|m_s, m_I>=|0,0>\rightarrow|+1,0>$ hyperfine transition of the upper resonance. One variation of Steps 308 and 312 may also involve changing which hyperfine transitions are driven from sample to sample. Doing so may provide some degree of randomization averaging that may be beneficial for certain applications.

In step 309 of the process 300, the estimated value for the lower resonance is input as an initial value into the first frequency-locking channel, which locks the MW drive frequency to the first transition frequency in a closed-loop manner such that the MW source is shifted in frequency to reflect any change in the frequency of the NV resonance caused by the magnetic field. The frequency-locking channel thus provides a direct measure of the NV resonance frequency independent of phenomenological variations in, e.g., laser or mw power. Note that, due to the locking, the process is also generally robust to the initial transition frequency estimate being offset from the resonance by reasonably small values. Consequently, the amount of processing time involved in extracting an accurate estimate for the initial transition frequency, the initial settling time of the frequency-locking channel, the processing power involved, and the overall achievable sampling speed of the magnetometer are all considerations that may be optimized for different applications. Step 313 is the analog of Step 309, but addresses the upper resonance of the crystal axis.

The process 300 includes a step 315 to extract temperature and magnetic field vector information from the frequencies of the upper and lower resonances of color centers (e.g., NV centers) along the chosen crystal axis. As a simple example, the magnitude of the sensed magnetic field along the chosen crystal axis can be approximated by computing the difference between the first and second lock-in frequencies obtained simultaneously from the two channels of the lock-in amplifier following steps 309 and 315 described above.

Recall that the crystal host in this example contains NV centers of eight possible orientations, corresponding to four different crystal axes. Measurements of the magnetic field vector information can be carried out along all four crystal axes by measuring from ensembles of NV centers belonging to each orientation class. This is indicated by step 317 in process 300 showing how Steps 306-315 may be repeated continuously for real-time measurements of the full magnetic field vector information, decoupled from temperature as indicated. Note that, as discussed previously, there are several approaches to choosing the crystal axis in step 306 for sequential measurement samples. For example, three crystal axes are sufficient to fully reconstruct the magnetic field vector in the Cartesian coordinate system, decoupled from temperature; consequently, one implementation of the process may cycle between only three crystal axes or may change which crystal axes are employed to optimize the sensitivity of the measurement. Another possible implementation for either the 3-crystal-axes or 4-crystal-axes cases is for the order of which crystal axis to be measured from sample to sample to be randomized in order to mitigate potential systematic errors from the sequential measurement scheme. Additionally randomizing sampling period may further mitigate systematic errors. Different implementations of step 306 may be appropriate for different applications with different requirements and constraints.

Finally, upon performing measurements along at least three of the four crystal axes, the temperature and magnetic field magnitude and direction information measured from three or four crystal axes can be combined to reconstruct the full magnetic field vector, decoupled from temperature. This magnetic field vector can be converted from the intrinsic tetrahedral coordinate frame of the NV-diamond system to the Cartesian coordinate space as indicated in step 319 of process 300. The result is real-time measurements of the full magnetic vector, decoupled from temperature effects (due to the simultaneous measurement of lower and upper resonances) and robust against phenomenological noise, e.g., due to mw and laser intensity noise (afforded by the use of the frequency-locking technique).

Process Diagram of an Example NV-Diamond Simultaneous Vector Magnetometer System FIG. 23 illustrates a process 2300 for simultaneous NV magnetometry using frequency-locking. Briefly, as shown in the flow path of process 2300 in FIG. 23, the crystal host containing color centers (e.g., NV centers) are first exposed to the magnetic field to be measured in step 2301. This magnetic field can be an external field of unknown or known magnitude and direction or a magnetic field internal to the crystal host. The step 2301 of process 2300 includes other methods of introduction of the magnetic field to the sensing magnetometer under other instances when the magnetic field may not be explicitly or actively applied to a crystal host containing color centers.

Suitable optical excitation and optical detection systems excite and/or detect fluorescence emitted by the color centers. Appropriate frequency locking systems use the emitted optical signal to locate the NV resonance frequency arising from driven state transitions and lock to that frequency in a closed-loop manner as explained in detail previously. As a brief review, however, an ensemble of NV centers in the crystal host can be excited by incident light, for example, a laser light source at a wavelength of 532 nm. The photoluminescence emitted by the crystal can be modulated by modulating the microwave drive of an NV resonance at a given modulation frequency. This photoluminescence signal can be focused by a suitable optical system onto an optical detector, which transduces the photoluminescence into an electrical signal (e.g., a photocurrent or voltage whose amplitude varies with the intensity of the photoluminescence) that can be demodulated at the modulation frequency to produce an error signal. Using the error signal as input to a feedback controller that adjusts the microwave drive frequency to minimize the error signal allows the microwave drive frequency to be locked to a chosen NV resonance.

For optimal effectiveness of the frequency-locking technique, having reasonable initial values for the NV resonance frequencies can be important. These initial values can be extracted in step 2305: the crystal host with the applied magnetic field is subjected to microwave (MW) radiation swept in a target range of frequencies that encompasses the frequencies of NV resonances expected to be generated in the diamond host. For example, the microwave source can be swept from about 2.65 GHz to about 3.1 GHz encompasses all NV resonance frequencies in the case where the applied magnetic field magnitude is less than or equal to 80 Gauss. The step 2305 can be an initialization step carried out once in the beginning of process 2300 and used to extract initial values for all 8 NV resonances corresponding to all 4 NV orientation classes.

In step 2306 of this process, some subset of the possible resonances may be chosen for performing continuous simultaneous frequency-locking measurements. In the example case of NV centers in diamond, there are 8 possible resonances, though as discussed previously simultaneous measurements of 4 NV resonances can be sufficient to extract the full magnetic field vector, decoupled from temperature. Consequently, a typical number of resonances to choose in step 2306 to simultaneously measure may be between 4 and 8, inclusive.

Steps 2308-2309 and 2312-2313 are performed simultaneously, where steps 2308 and 2309 correspond to measurements on the first chosen resonance and steps 2312 and 2313 stand in for parallel measurements along the remaining n−1 chosen resonances. In some instances of the process 2300, an initial value for the first chosen resonance frequency may be estimated in Step 2308; this initial value may be extracted from the initialization step 2306 or may be extracted from the most recent or last n reconstructions of the total magnetic field vector, for example. Different algorithms for estimating an initial value for the lower resonance may be appropriate for different situations depending on considerations of, e.g., processing speed and/or accuracy of the initial estimate. Step 2312 is the analog of Step 2308, but addresses the remaining n−1 resonances involved in the measurement.

Note that during the typical course of operation of the magnetometer, a new estimation of an initial value for a given resonance frequency corresponding to steps 2309 and 2313 may not be necessary as the channel will already be frequency-locked to the NV resonance. However, as discussed previously, there may be occasional situations (e.g., after initialization or to optimize sensitivity) that which specific NV resonances are involved in the measurement or even the number of NV resonances involved in the measurement may be changed. Following these NV resonance updates, it may be suitable to extract an estimated transition frequency to use as an initial input value into the frequency-locking channel.

Recall from previous discussion that due to possible depopulation and first order coherent driving effects, it is typically preferable to avoid driving the same hyperfine transition in both upper and lower resonances. Consequentially, for example, one may drive the $|m_s, m_I\rangle = |0,-1\rangle \rightarrow |-1,-1\rangle$ hyperfine transition of the lower resonance and the $|m_s, m_I\rangle = |0,0\rangle \rightarrow |+1,0\rangle$ hyperfine transition of the upper resonance. Alternatively, one may drive only one resonance corresponding to each crystal axis.

In step 2309 of the process 2300, if desired, the estimated value for the 1st resonance can be input as an initial value into the first frequency-locking channel, which locks the MW drive frequency to the first transition frequency in a closed-loop manner such that the MW source is shifted in frequency to reflect any change in the frequency of the NV resonance caused by the magnetic field. The frequency-locking channel thus provides a direct measure of the NV resonance frequency independent of phenomenological variations in, e.g., laser or mw power. Note that, due to the locking, the process is also generally robust to the initial transition frequency estimate being offset from the resonance by reasonably small values. Consequently, the amount of processing time involved in extracting an accurate estimate for the initial transition frequency, the initial settling time of the frequency-locking channel, the processing power involved, and the overall achievable sampling speed of the magnetometer are all considerations that may be optimized for different applications. Step 2313 is the analog of Step 2309, but addresses the remaining n−1 chosen resonances.

Once simultaneous measurements have been performed on a sufficient number of NV resonances, the measured frequencies can be employed to reconstruct the full magnetic field vector, indicated by step 2319 of process 2300. These real-time measurements of the full magnetic vector are decoupled from temperature effects (due to the simultaneous measurement of lower and upper resonances) and robust against phenomenological noise, e.g., due to mw and laser intensity noise (afforded by the use of the frequency-locking technique).

On occasion, for some implementations of process 2300, the extracted real-time magnetic field measurement may be used to improve the magnetometer operation. For example, as discussed previously, one may wish to change which resonances are employed in the measurement in order to, e.g., maintain optimized magnetic sensitivity. In another example, one may which to change the number of resonances are employed in the measurement in order to, e.g., additionally overdetermine the system for the purpose of resolving ambiguities that occur in the presence of certain magnetic field configurations. This is indicated by the arrow starting at step 2319 and ending at step 2306. Note that these optional, occasional updates of the measured resonances take very little overhead in terms of measurement time and may substantially improve the time-averaged magnetic sensitivity and robustness of a magnetometer, depending on the application.

Block Diagram of an Example NV-Diamond Magnetometer System

Figure 4A:
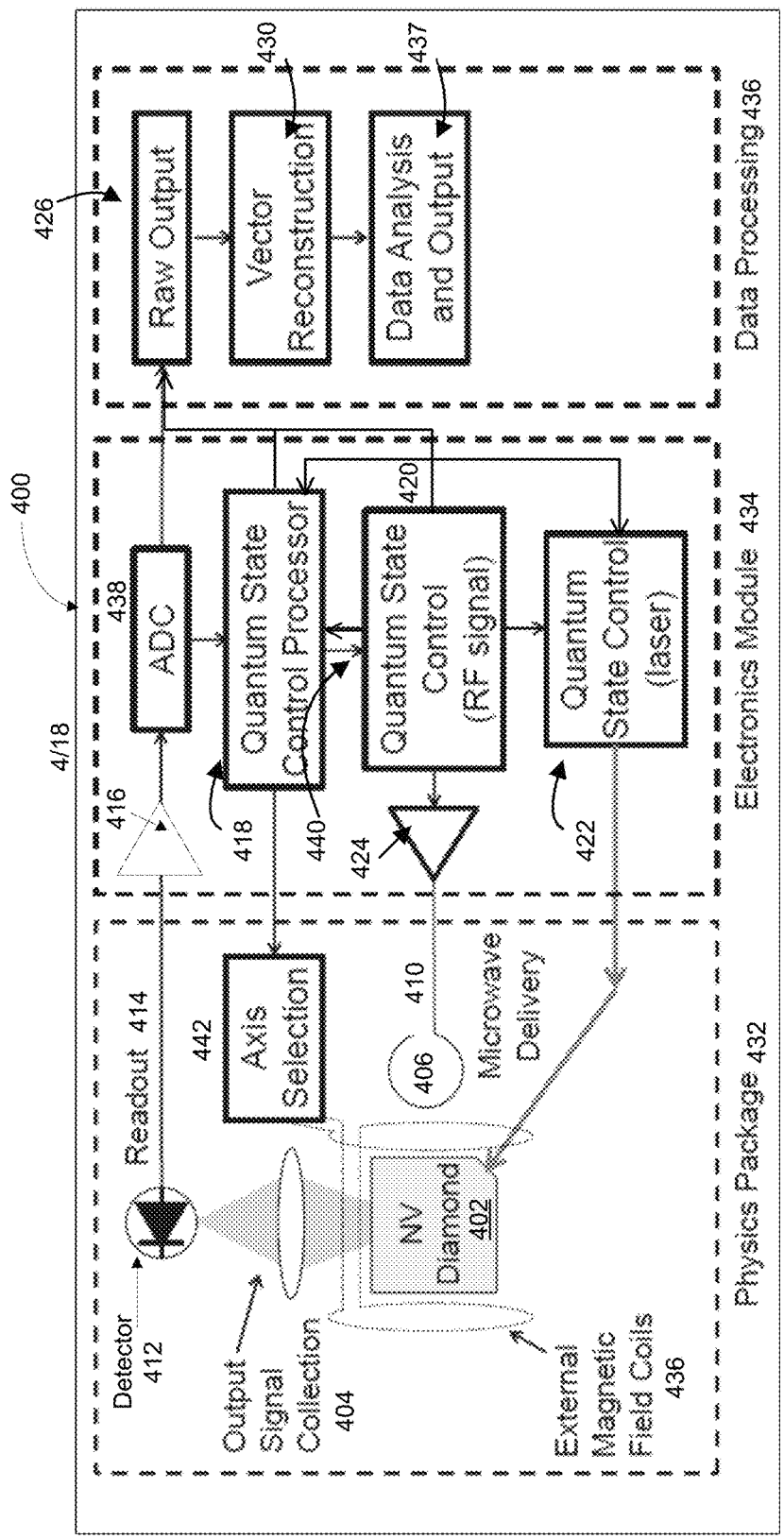
FIG. 4A shows a block diagram of an example apparatus with physics, electronics and data processing units used to measure magnetic field vectors sensed by an ensemble of color centers in a solid-state host.
Figure 4B:
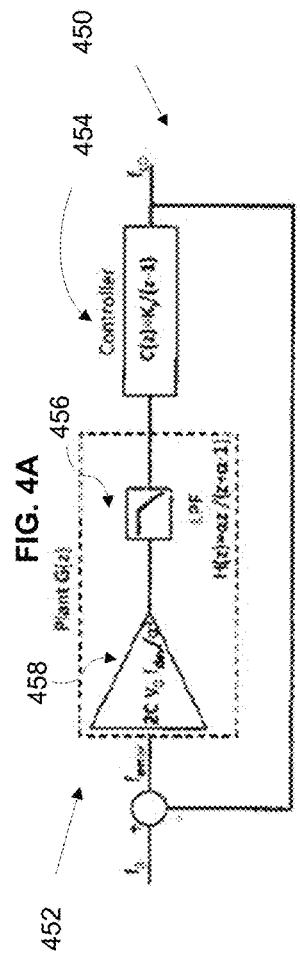
FIG. 4B shows a schematic of a linearized model of feedback control in an example magnetometer.

FIG. 4A shows an example frequency-locking magnetometer 400, in the form of a block diagram. The example magnetometer in FIG. 4A includes three modules or packages: a physics package 432, an electronics package 434, and a data processing package 436. The physics package 432 includes a crystal (e.g., diamond) host 402 containing NV centers or other color centers, a microwave delivery mechanism 406 of some geometry (e.g., an antenna or resonant cavity) to drive the diamond host 402 with microwave excitation, and optical signal collection elements 404 with an associated optical detector 412 (for example, one or more silicon photodetectors, possibly referenced against the optical excitation intensity produced by the Quantum State Control (laser) unit 422 discussed later, in a noise-balancing modality) to collect and measure the emitted optical signal and produce an optical readout 414. In some embodiments of the magnetometer 400, the physics package 432 can also include an axis selection unit 442, which may, for example, include an applied magnetic field source 436 that splits the NV resonances, making them non-degenerate and able to be individually addressed via resonant microwave irradiation. This applied magnetic field source 436 may produce static or dynamically adjustable magnetic fields using, for example, coils or permanent magnets, in some embodiments of the magnetometer 400. Alternative implementations of the axis selection unit 442 not related to magnetic field production are also possible, depending on application.

The electronics package 434 of the magnetometer 400 can include an amplifier 416 that receives the optical read out 414 from the optical detector 412. The amplified optical signal can be input into an analog to digital convertor (ADC) 438, which can in turn be connected to a Quantum State Control Processor (QSCP) 418, also part of the electronics package. The QSCP 418 can receive digitized signals from the ADC 438 and process the signals. In some instances, the QSCP 418 can function as or be a lock-in amplifier. The QSCP 418 may also send outputs to the axis selection unit 442 which can be a part of the physics package 432, in some instances.

The electronics package 434 can include a first Quantum State Control Radio Frequency unit (QSC-RF) 420 that is connected to the QSCP 418 and is configured to control RF signal generation and delivery. The QSC-RF unit 420 can be configured to receive signals from and transmit signals to the QSCP 418. The QSC-RF unit 420 can be connected to and send signals to a second amplifier 424 that in turn delivers an amplified microwave signal 410 to drive the diamond host 402 via the microwave delivery unit 406. The electronics package 434 can also include a second Quantum State (laser) unit 422 that is connected to and receives signals from the QSCP 418 and the first QSC-RF 420. The second QSC-Laser unit 422 can be configured to control the laser light that illuminates the crystal host 402. The QSC-RF 420 and QSC-Laser 422 units, including example implementations, are discussed in more depth later.

The example frequency lock-in magnetometer illustrated in FIG. 4A can also include a data processing component 436 that includes a raw output unit 426 that may receive output signals such as the raw output from the ADC 438 of the electronics package 434, the lock-in signal from the QSCP 418 of the electronics package 434, and/or the MW drive frequency or frequencies from the QSC-RF 420. This unit 426 can be connected to and send signals to a vector reconstruction unit 430 that controls vector reconstruction (for example, as described in step 319 of the process 300 illustrated in FIG. 3) of the magnetic field extracted from measurements (for example, according to steps 301 to 315) along the various crystal axes (for example, following steps 315 and 317). That is, the vector reconstruction unit 430 receives signals that allow for estimations of the magnetic field magnitude, magnetic field direction, and temperature corresponding to the different crystal axes, for example, along the tetrahedral coordinate system of the NV center and reconstructs the magnetic field vector in the Cartesian coordinate system.

The data processing component 436 of the magnetometer 400 can also include a data analysis and output unit 437 that analyzes and generates an output that includes the magnitude and direction of a sensed magnetic field.

One example implementation of the process for measuring a magnetic field B is as follows: a signal generator denoted by a quantum state control (RF signal) unit 420 outputs a microwave signal with center frequency $f_{LO}$, modulated at frequency $f_{ref}$ with depth $f_{dev}$ to produce a time-dependent frequency given by:

$$f_{mod}(t) = f_{LO} + f_{dev} \cos(2\pi f_{ref} t) \quad (16)$$

The signal is then sent via an amplifier 424 to an antenna 406 which drives the diamond sample 402 with the modulated microwave field. The fluorescence signal from the NV ensemble is collected through signal collection unit 404 and detected with a photodetector 412. The resulting signal 414 converted to a digital signal through the analog-to-digital converter (ADC) 438 and subsequently demodulated by a lock-in amplifier 416. The phase of the lock-in amplifier 416 is set such that the in-phase component of the lock-in signal is positive (negative) if $f_{LO}$ is slightly above (below) the NV transition frequency, whereas the lock-in signal is zero when $f_{LO}$ is directly on resonance with the NV transition frequency. A feedback compensator within the quantum state control processor 418, comprising a discrete integrator controller (not shown), produces an error signal 440 (indicated by an arrow from the QSCP 418 to the QSC-RF 420) from the lock-in signal. The error signal 440 in turn provides feedback to adjust the microwave source frequency $f_{LO}$, and lock it to the center of the NV resonance. Note that here we have described an example implementation; there are a variety of implementations for each unit in the block diagram, each can be adapted for different applications with different requirements and constraints.

When appropriate during the process, the NV diamond host is optically excited, for example, by laser light from another quantum state control (QSC-laser) unit 422. The QSC-laser unit 422 can be used to control the laser light delivery and can in turn receive feedback or other input from the quantum state RF control unit 420 and/or the quantum state control processor 418 mediating the error signal among other sources of input.

In an n-frequency-channel implementation of this technique, each NV resonance can be modulated at a different frequency $f_{ref,n}$ to allow for demodulation of all channels simultaneously. In this way, individual lock-in signals and subsequent error signals are extracted for each frequency channel concurrently.

The dynamics of the feedback loop can be analyzed by forming a linear approximation to the system with an integrator controller to increase the open-loop DC gain to minimize steady-state error. Examining the open loop transfer function, $$L(z) = \frac{2CV_0}{\sigma^2} f_{dev} K_I \frac{\alpha z}{z + \alpha - 1} \cdot \frac{z}{z - 1},$$

shows that the open loop gain depends on the following experimental parameters: contrast (C), fluorescence amplitude ($V_0$), integrator gain ($K_I$), and resonance linewidth ($\sigma$). In a deployable system where periodic calibration is impractical, laser and microwave fluctuations may affect the accuracy of the sensor. The addition of a feedback loop allows locking into the frequency of the resonances. This closed loop transfer function is given by $$T(z) = \frac{L(z)}{1 + L(z)},$$

removing the dependence on these scale factors.

The example magnetometer system described above and shown in FIG. 4A can be used to carryout measurements along all NV axes using the axis selection mechanism 442, which may, for example, include an applied magnetic field source 436 that splits the NV resonances, making them non-degenerate and able to be individually addressed via resonant microwave irradiation. This applied magnetic field source 436 may produce static or dynamically adjustable magnetic fields using, for example, coils or permanent magnets, in some embodiments of the magnetometer 400. Alternative implementations of the axis selection unit 442 not related to magnetic field production are also possible, depending on application. This axis selection mechanism 422 may be dynamically adjusted by the quantum state processor 418.

Compact NV-Diamond Magnetometer

Figure 5:
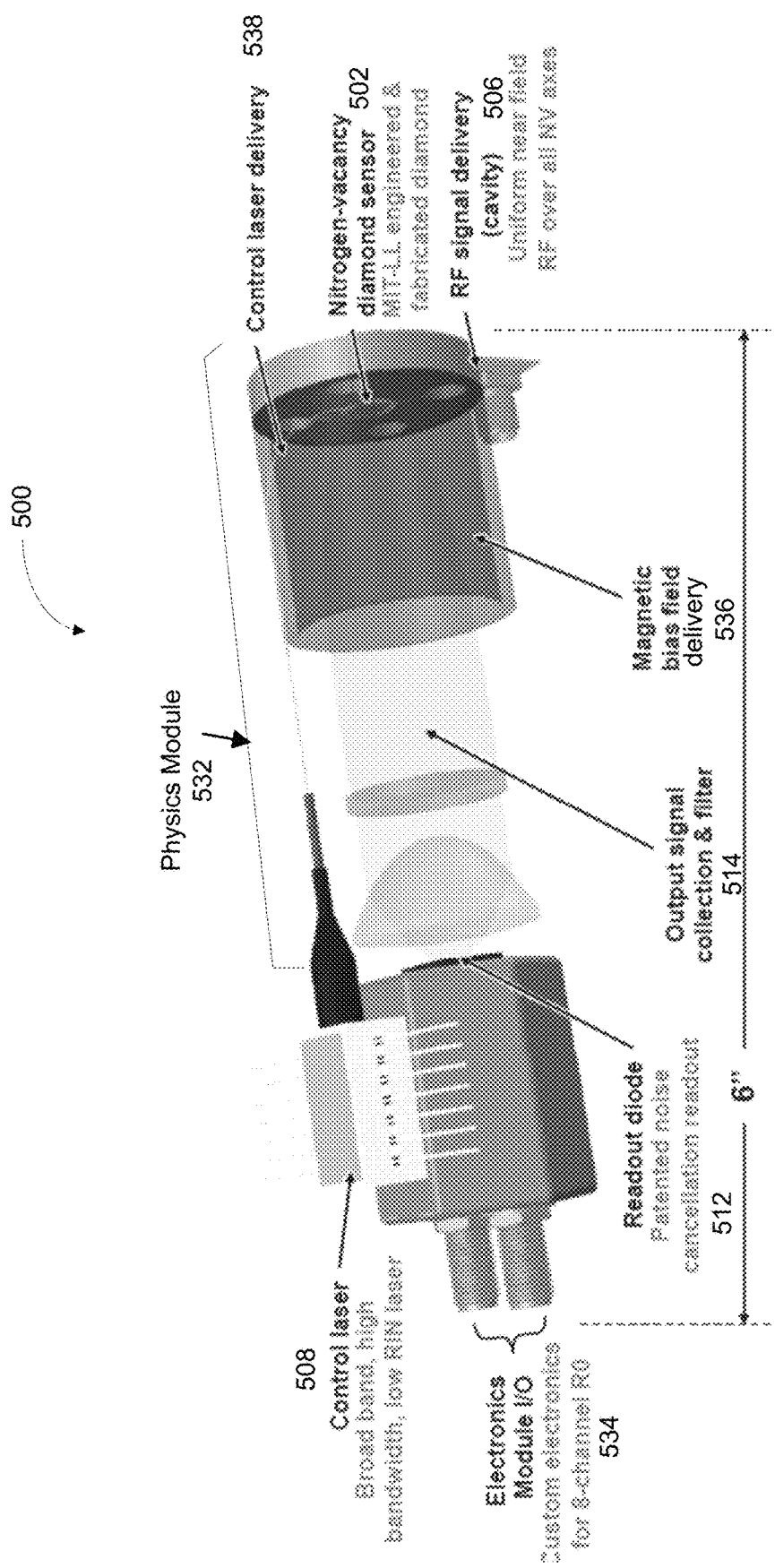
FIG. 5 shows an example compact magnetometer with a solid-state host containing many color centers.

FIG. 5 shows an example compact magnetometer 500 with some of the individual components outlined in FIG. 4 assembled into a compact module. In this example, the physics module 532 includes, among other components, an NV-diamond sensor 502, an RF signal delivery system 506, a bias magnetic field delivery system 536, a control laser delivery system 538 from a control laser source 508, optical collection optics 514, and a read-out diode detector 512. The magnetometer 500 may also include an electronics module 534 to implement frequency-locking. The NV-diamond sensor 502 can be fabricated precisely and cut with known crystal axes. The RF signal delivery system 506 can be controlled by a quantum state control unit (not shown in FIG. 5) and coupled to a quantum state control processor unit (also not shown in FIG. 5) to deliver the appropriate microwave radiation signal to drive the NV-diamond sensor 502. The bias magnetic field delivery system 536 can be configured to deliver the magnetic field. The control laser delivery system 538 can be controlled by a quantum state control unit (not shown in FIG. 5) to deliver, e.g., laser light from a control laser source 508 onto the NV diamond sensor 502. The control laser source 508 can be a broad band, high-bandwidth source with low relative intensity noise to ensure optimal excitation and reduced or minimized noise for frequency-locking. The compact magnetometer 500 shown in FIG. 5 can also be configured to be a hand-held magnetometer measuring no more than six inches of length, as indicated in FIG. 5. It could also be packaged in a larger form, e.g., suitable for a bench top or mounting on a breadboard.

Note that this example compact magnetometer 500 illustrates some ways in which the NV system is particularly well-suited as a compact magnetometer. For example, the solid-state diamond crystal host allows for a very high density of NV centers to be incorporated into a very small NV-diamond sensor 502, which likewise relaxes size, uniformity, and complexity constraints many of the other components, such as the magnetic bias field delivery 536 and RF signal delivery 506 for example. Furthermore, control of the NV system requires fairly low overhead, indicated by the relatively relaxed specifications for, e.g., the control laser 508.

Experimental Demonstrations of Magnetometer Systems
Simultaneous 2-Channel Frequency-Locking In an example experiment, a dual-channel, frequency locking NV magnetometer was implemented by employing a field-programmable gate array (FPGA) (commercially available) and a high-speed digital-to-analog-converter to digitally synthesize two carrier signals with frequencies that could be independently tuned and modulated. The generated signal was amplified with an amplifier (AMF-4B-02000400-20-33P LPN, Miteq) and sent to a loop antenna to produce a microwave field at the diamond sample, which contained a large ensemble of NV centers ($\sim 1 \times 10^{13}$). The diamond sample was optically excited with a 532-nm laser (Verdi V8, Coherent) in a light-trapping diamond waveguide geometry for increased optical excitation efficiency. The resulting fluorescence was collected with a balanced photodetector (New Focus) where a pick-off from the laser was directed into the balancing port to remove common mode laser noise. The lock-in amplifiers for demodulating the balanced photodetector signal and feedback compensators for locking to the NV resonances were also programmed into the FPGA, which continuously put out the two locked frequencies to a computer.

Note that the effectiveness of the photodetector in balancing out laser intensity noise can have a significant effect on the technical noise floor of the NV magnetometer system and consequently on the magnetic sensitivity of the measurements. For example, recall that in FIG. 10A, in addition to the expected 1/f noise<2 kHz, there is noise above the shot noise limit at modulation frequencies>6 kHz. Poor photo-detector balancing may be the source of either or both of these noise features, which have deleterious effects, such as limiting the range of modulation frequencies that provide optimal sensitivity in lock-in based techniques.

Figure 9A:
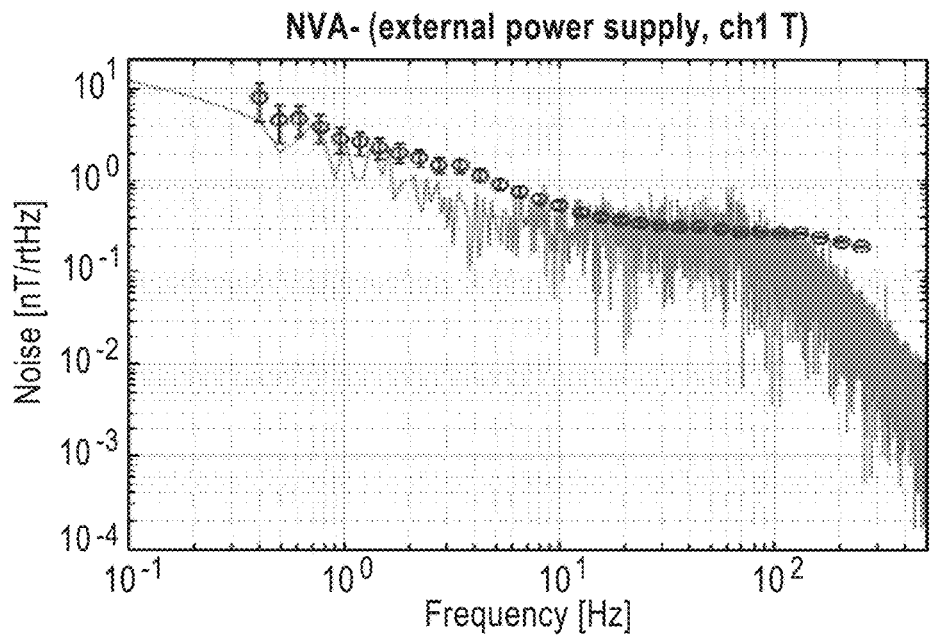
FIGS. 9A and 9B are example plots of noise spectra, showing shot-noise limited sensitivity in one channel of an amplifier in an example magnetometer apparatus, where the photodetector is powered by an external power supply or by a battery, respectively.
Figure 9B:
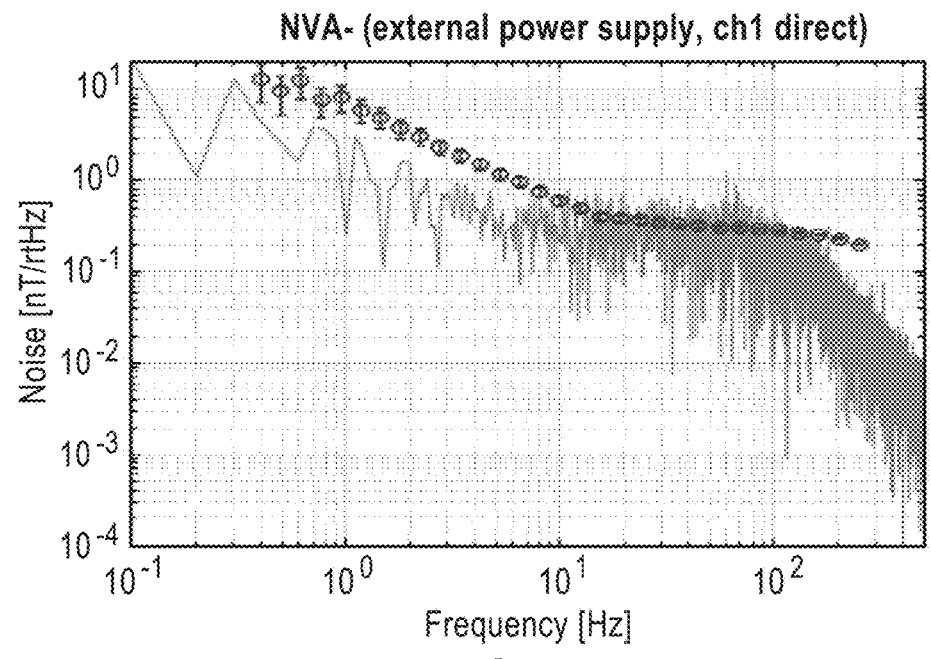

Another possible source of noise in the photodetector in particular is noise from a power source being coupled into the photodetector bias voltage. FIGS. 9A and 9B show the noise spectral density plot of data obtained during magnetic field measurements superimposed by expected estimation of noise floor, from a single channel of the amplifier under two conditions. FIG. 9A shows noise spectral density when the apparatus of the magnetometer was powered by an external power supply, and FIG. 9B shows the noise spectral density when the apparatus was powered by a battery. As shown the measurements were above the shot-noise limit by the expected amount given 1/f noise in the laser over the frequency range shown, for both power sources. Specifically, the sensitivity at a power of 1.8 W was measured to be 172 pT/Hz$^{1/2}$. These measurements illustrate that proper choice of an external power supply does not contribute to the technical noise as compared a batter, canonically the most quiet power source. However, note that the measurement noise was above the shot noise limit by a factor of 1.6 indicating that in this example system, technical noise can be improved.

Permanent magnets arranged in a Halbach array configuration produced a uniform magnetic bias field $B_0 \approx 7.8$ mT over the diamond such that each of the four possible NV orientation classes in the diamond crystal experienced a different magnetic field projection. The dual-channel frequency-locking NV magnetometer simultaneously locked to both the $m_s=0 \to \pm 1$ transitions of a single NV orientation in order to decouple the effects of temperature and magnetic field and thus extracted the magnetic field projection along the NV symmetry axis.

Applying simultaneous microwave driving at both transition frequencies of an NV orientation class can produce a depopulation effect, which changes the shape of the ODMR spectra at one resonance due to the drive applied at the corresponding resonance. However, due to hyperfine interactions between the NV electronic spin and the nuclear spin I=1 of the more naturally abundant $^{14}$N isotope, each NV $m_s=0 \to \pm 1$ transition was composed of three transitions separated by ~2 MHz (see example ODMR spectrum in FIG. 2B). Consequently, one frequency channel was set to the $|0, -1\rangle \to |-1, -\rangle$ transition with the other channel set to $|m_s, m_I\rangle = |0, 0\rangle \to |+1, 0\rangle$ transition to avoid this depopulation effect.

Figure 7A:
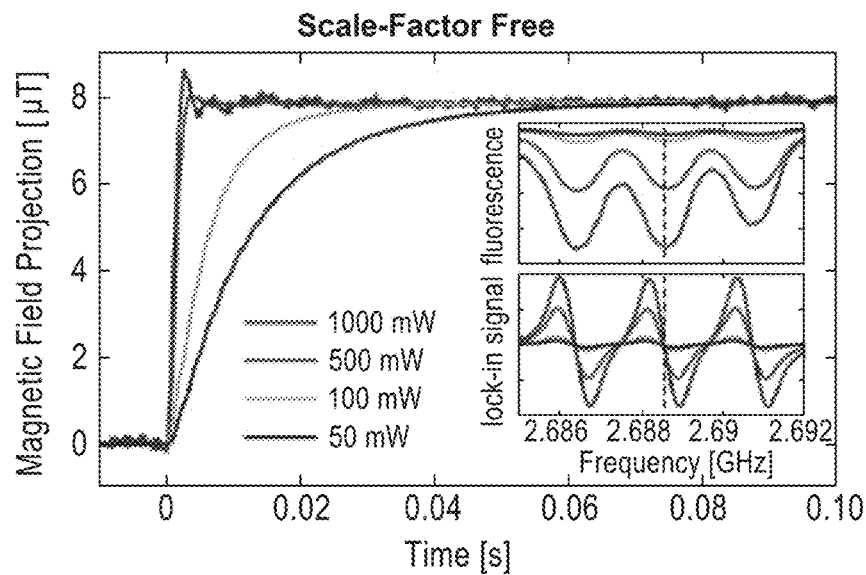
FIG. 7A shows an example of experimentally measured magnetic field projections as a function of incident laser light, illustrating the scale factor-free nature of measurements.

FIG. 7A demonstrates the robustness of the frequency-locking NV magnetometer against changes in phenomenological variables, such as optical pump and microwave drive power, in an example implementation. The $m_s=0 \to \pm 1$ transitions of the NV orientation class that is most aligned to the applied magnetic field were frequency locked with, using modulation frequencies $f_{ref,1}=3$ kHz and $f_{ref,2}=4$ kHz and modulation depths $f_{dev,1,2}=500$ kHz. Upon varying the optical pump power, drastic differences in the contrast of the ODMR resonance were observed (upper inset), which corresponded to different slopes in the lock-in signal (lower inset). Under these circumstances, previous lock-in-based implementations measured changes in the magnetic field that are off from the actual values, with the discrepancy being proportional to the difference between the current lock-in slope and the last calibration of the lock-in slope. Using the inventive frequency locking technique applied to two or more NV resonances, simultaneously, even while large variations in the optical pump power can result in varying transient responses to a step input, the measured steady-state magnetic field remained consistent.

Figure 7B:
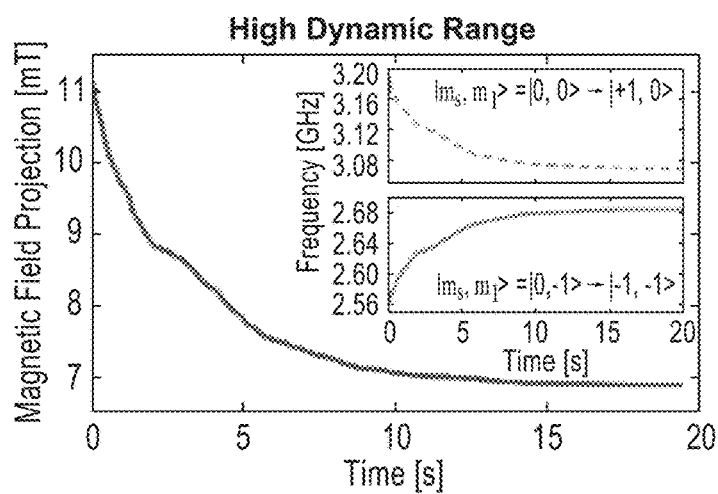
FIG. 7B shows an example experimental measurement of magnetic field projection as a function of time, with insets corresponding to measurements of the NV resonance frequencies measured simultaneously, highlighting the dynamic range of an example magnetometer, which is also insensitive to temperature effects.
Figure 7C:
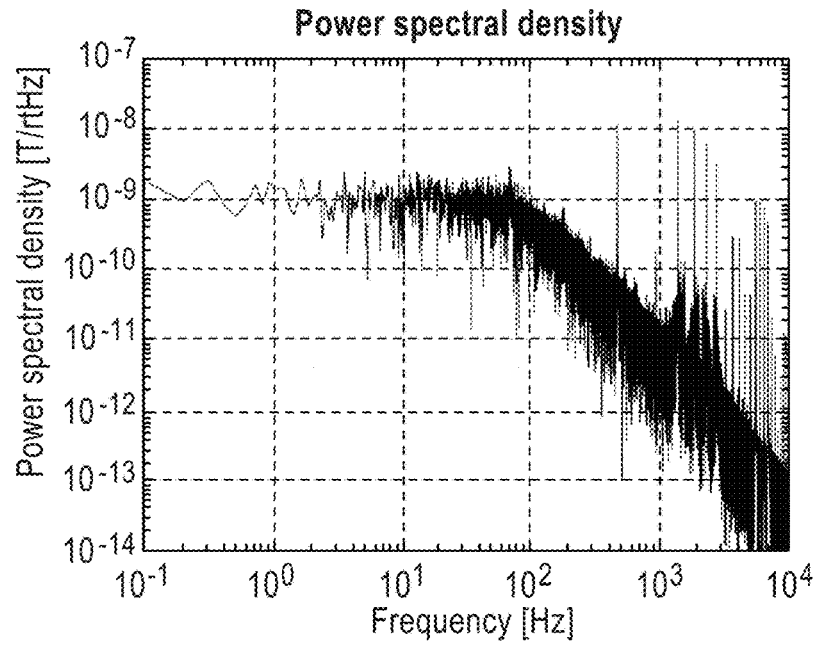
FIG. 7C shows the noise spectrum of an example magnetic field measurement, illustrating the magnetic sensitivity of the measurement.

Employing a permanent magnet to vary the magnetic field experienced by the frequency-locking NV magnetometer, a dynamic range~4 mT could be demonstrated as shown in FIG. 7B. The dynamic range of this technique could reach to ~10 mT limited only by spin state mixing destroying fluorescence signal contrast. In contrast, in an open-loop lock-in based implementation, the dynamic range was limited to the linear region of the ODMR derivative signal, $$\approx \frac{h\sigma}{4g_e\mu_B},$$

where $\sigma$ is the linewidth of the NV resonance. For a typical $\sigma \approx 1$ MHz, the dynamic range was 10 µT, approximately one order of magnitude less than the range demonstrated here and three orders of magnitude less than the expected limit. Furthermore, the frequency-locking technique allows for the magnetic sensitivity to be maintained over the full dynamic range of the NV center. FIG. 7C shows magnetic sensitivity illustrated in the noise spectrum of an example measurement using the magnetometer described above.

While the dynamic range of the current dual channel frequency locking NV magnetometer may be limited the 2.4 GHz bandwidth of the MW amplifier, this can be easily addressed by employing additional or alternative electronics. Simultaneous detection of fields along all four possible diamond tetrahedral directions and performing real-time analysis to take advantage of the redundancy of the over-determined system can help overcome the ambiguity inherent in measurements where individual NV resonances cross and/or are degenerate at crossover points. This can be achieved by implementing an 8-channel magnetometer capable of robustly tracking the magnetic field through ambiguous crossover points.

In this experimental demonstration, without sacrificing sensitivity or measurement speed, measurements achieved a dynamic range of about 4 mT, corresponding to a factor>10 improvement over some previous implementations of lock-in-based NV magnetometers. This versatility is extremely useful for sensing previously unknown magnetic fields where variations over a wide range are expected.

Sequential Vector Magnetometry Via Simultaneous 2-Channel Frequency-Locking

In one implementation of the magnetometer detailed above, a Halbach array of permanent magnets applied a uniform magnetic field over an NV ensemble within a diamond sample causing Zeeman splitting in the $m_s=0\rightarrow\pm1$ transitions of the four NV orientation classes and producing eight distinct NV resonances, each with three hyperfine transitions. The results are shown in FIG. 6A. The microwave frequency was swept from 2.65 GHz to 3.1 GHz.

The magnetometer was simultaneously frequency-locked to the $[m_s, m_I]=[0, -1]\rightarrow[-1, -1]$ and $[0,0]\rightarrow[+1,0]$ hyperfine transitions of a single NV orientation class (corresponding to the thin solid and dashed lines, respectively, in FIG. 6A) and sequentially iterated through each NV orientation, with a 0.1-second dwell time per resonance pair. The vertical lines indicate the frequencies that were locked to.

A set of three-axis coils applied additional 10 µT magnetic fields along three orthogonal directions. Specifically, a 0.2 G field was applied in the x direction for 10 seconds, then the y direction, and then the z direction. FIG. 6B shows the resulting NV resonance frequency shifts of each of the eight resonances in FIG. 6A, as a function of time, detected using this method of locking to four pairs of NV transitions in rapid sequence. Using the NV Hamiltonian and the known, rigid tetrahedral geometry of diamond crystal makes it possible to reconstruct the magnetic field vector by performing non-linear optimization of the over-constrained system, which resulted from having measurements of the magnetic field projections along four directions rather than three.

FIG. 6C shows magnetic field components reconstructed from the frequency data in FIG. 6B, according to the step 319 in the process 300 in FIG. 3. The illustrations on the left show the tetrahedral frame of reference of the NV axes and the Cartesian frame of reference in which the directionality of the magnetic field is finally determined.

The reconstructed magnetic field vector presented in FIG. 6C was in excellent agreement with the expected magnetic field produced by the calibrated three-axis coils. Notably, the tetrahedral co-ordinate system of the NV center served as an optimal measurement system with a redundant axis, thereby providing $2/\sqrt{3}$ improvement in sensitivity over a measurement made in the Cartesian system. Further, failure along any one axis could be tolerated with loss in sensitivity of at most a factor of 2.

Simultaneous Vector Magnetometry Via Simultaneous 8-Channel Frequency-Locking

In one implementation of an NV vector magnetometer, detailed above, a Halbach array of permanent magnets applied a uniform magnetic field over an NV ensemble within a diamond sample causing Zeeman splitting in the $m_s=0\rightarrow\pm1$ transitions of the four NV orientation classes and producing eight distinct NV resonances, each with three hyperfine transitions. To perform an initial demonstration of the simultaneous vector magnetic sensing capability, we mounted the example NV magnetometer implementation and a commercial fluxgate sensor in proximity to each other in an unshielded lab environment.

Performing simultaneous 8-channel frequency-locking measurements allowed for the extraction of all 8 NV resonance frequencies simultaneously. In this implementation, the 8 modulation frequencies were chosen from within the range 2.5 kHz to 3.7 kHz. The magnetic field projection along each of the four crystal axes could be extracted by using the 8 resonance frequencies to numerically solve the NV ensemble vector Hamiltonian for the full magnetic field vector, decoupled from temperature. In a simple example, however, the magnetic field projection along each crystal axis may approximated by dividing the difference between the upper and lower resonance frequency corresponding to each orientation class by the fundamental-constant-dependent Zeeman splitting term, as indicated previously in Equation (14).

Noise spectra could then be extracted from these measurements of the magnetic field along each of the crystal axes both as an indication of the magnetic sensitivity achieved by each NV orientation class and as an indication of potential crosstalk between the 8 frequency-locking channels. These noise spectra are shown in FIGS. 21A-21D for each of the NV orientation classes, labeled NV A, NV B, NV C, and NV D, respectively. Note that each noise spectrum has roll-off behavior for higher measurement frequencies (>10 Hz in this example case), attributable to a combination of the lock-in parameters and the frequency-locking feedback controller parameters. The time constant and steepness of this roll-off can be easily adjusted to be suitable for different applications by modifying the lock-in and frequency-locking feedback controller parameters, even dynamically during a measurement.

Note from the noise spectra of an example measurement from the example implementation that in this case, while there are significant cross-talk effects in the 1-10 kHz range and some additional cross-talk effects in the 10 Hz-1 kHz range, there are no observable cross-talk effects in the measurement bandwidth of the example simultaneous vector magnetometer implementation. Furthermore, generally, the position of the cross-talk features as well as the strength of their effects can be adjusted with careful choice of the modulation frequencies, lock-in parameters, and/or frequency-locking feedback controller parameters. Consequently, cross-talk effects can generally be minimized and/or made negligible by adjusting the modulation frequencies employed in the frequency-locking channels, the lock-in parameters, and the frequency-locking feedback controller parameters as appropriate for specific applications.

Finally, we can compare the measured sensitivity extracted from the noise floor of the measurement over frequencies<10 Hz against the expected the expected shot-noise-limited sensitivity for each NV orientation class and find that they are in good agreement. Recall that this measurement represents an initial demonstration of a simultaneous vector magnetometer using the simultaneous 8-channel frequency locking technique; consequently there is significant room for improving various experimental parameters to optimize sensitivity.

To demonstrate the simultaneous vector capability of the example NV magnetometer implementation, we mounted it and a commercial fluxgate sensor in proximity to each other in an unshielded lab environment. We then moved large magnetic objects around far away from the sensors to ensure that both devices experienced similar magnetic field variations. FIGS. 22A and 22B show agreement between the magnetic field projections measured by the NV apparatus and the commercial fluxgate sensor. This represents the first demonstration of simultaneous vector magnetometry with NV centers in diamond, tied to fundamental constants with vector axes set by the inherent, stable diamond crystal lattice.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of" "only one of" or "exactly one of." "Consisting essentially of" when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in Section 2111.03 of the United States Patent Office Manual of Patent Examining Procedure.

The invention claimed is:

1. A method of measuring a magnetic field with a solid-state host disposed within the magnetic field, the solid-state host comprising a first ensemble of color centers oriented along a first crystal axis of the solid-state host, the first ensemble of color centers exhibiting a first resonance in a presence of the magnetic field, the method comprising:
   frequency-locking a first microwave signal to the first resonance; and
   determining an amplitude and/or direction of the magnetic field based on a frequency of the first microwave signal.

2. The method of claim 1, wherein frequency-locking the first microwave signal to the first resonance comprises shifting the frequency of the first microwave signal in response to a change in the magnetic field.

3. The method of claim 1, wherein the first resonance represents a first energy-level transition.

4. The method of claim 3, wherein the first energy-level transition is a first hyperfine transition.

5. The method of claim 1, wherein determining the amplitude and/or direction of the magnetic field comprises determining the amplitude of the magnetic field with a dynamic range of about 360 µT to about 100,000 µT.

6. The method of claim 1, wherein the first ensemble of color centers exhibits a second resonance in a presence of the magnetic field, and further comprising:
   frequency-locking a second microwave signal to the second resonance while frequency-locking the first microwave signal to the first resonance, and
   wherein determining the amplitude and/or direction of the magnetic field is based on a frequency of the second microwave signal.

7. The method of claim 6, wherein the second resonance represents a second energy-level transition different than the first energy-level transition.

8. The method of claim 6, wherein determining the amplitude and/or direction of the magnetic field comprises taking a difference between the frequency of the first microwave signal and the frequency of the second microwave signal.

9. The method of claim 1, wherein the solid-state host comprises a second ensemble of color centers oriented along a second crystal axis of the solid-state host and exhibiting a second resonance and a third ensemble of color centers oriented along a third crystal axis of the solid-state host and exhibiting a third resonance in the presence of the magnetic field, and further comprising:
   frequency-locking a second microwave signal to the second resonance while frequency-locking the first microwave signal to the first resonance; and
   frequency-locking a third microwave signal to the third resonance while frequency-locking the first microwave signal to the first resonance and frequency-locking the second microwave signal to the second resonance.

10. The method of claim 9, wherein determining the amplitude and/or direction of the magnetic field is further based on a frequency of the second microwave signal and a frequency of the third microwave signal.

11. The method of claim 1, wherein frequency-locking the first microwave signal to the first resonance comprises:
    detecting light emitted by the first ensemble of color centers;
    determining an error signal based on the light emitted by the first ensemble of color centers, the error signal representing a different in frequency between the first microwave signal and the first resonance; and
    feeding the error signal back to a microwave source generating the first microwave signal.

12. The method of claim 1, wherein determining the amplitude and/or direction of the magnetic field based on the frequency of the first microwave signal comprises tracking a frequency of the first resonance independent of non-fundamental experimental parameters.

13. The method of claim 12, wherein the non-fundamental experimental parameters comprise laser intensity noise and microwave power fluctuations.

14. The method of claim 1, wherein the solid-state host comprises a second ensemble of color centers oriented along a second crystal axis of the solid-state host and exhibiting a second resonance and a third ensemble of color centers oriented along a third crystal axis of the solid-state host and exhibiting a third resonance in the presence of the magnetic field, and further comprising:
    cyclically frequency-locking the first microwave signal to the first resonance, the second resonance, and the third resonance.

15. A system for measuring a magnetic field, the system comprising:
    a solid-state host comprising a first ensemble of color centers oriented along a first crystal axis of the solid-state host, the first ensemble of color centers exhibiting a first resonance in a presence of the magnetic field;
    a microwave signal generator, in electromagnetic communication with the solid-state host, to drive the first ensemble of color centers with a first microwave signal;
    a photodetector, in optical communication with the solid-state host, to detect a first fluorescence signal emitted by the first ensemble of color centers, the first fluorescence signal representing the first resonance;
    circuitry, operably coupled to the microwave signal generator and the photodetector, to frequency-lock the first microwave signal to the first resonance based on the first fluorescence signal; and
    a processor, operably coupled to the circuitry, to determine an amplitude and/or direction of the magnetic field based on a frequency of the first microwave signal.

16. The system of claim 15, wherein the first ensemble of color centers exhibits a second resonance in a presence of the magnetic field, the circuitry is configured to frequency-lock a second microwave signal to the second resonance, and the processor is configured to determine the amplitude and/or direction of the magnetic field based on a frequency of the second microwave signal.

17. The system of claim 16, wherein the second resonance represents a second energy-level transition different than the first energy-level transition.

18. The system of claim 16, wherein the processor is configured to determine the amplitude and/or direction of the magnetic field comprises by taking a difference between the frequency of the first microwave signal and the frequency of the second microwave signal.

19. The system of claim 15, wherein the solid-state host comprises a second ensemble of color centers oriented along a second crystal axis of the solid-state host and exhibiting a second resonance and a third ensemble of color centers oriented along a third crystal axis of the solid-state host and exhibiting a third resonance in the presence of the magnetic field and wherein the circuitry is configured to frequency-lock a second microwave signal to the second resonance and to frequency-lock a third microwave signal to the third resonance.

20. The system of claim 19, wherein the processor is configured to determine the amplitude and/or direction of the magnetic field based on a frequency of the second microwave signal and a frequency of the third microwave signal.

21. The system of claim 15, wherein the circuitry is configured to shift the frequency of the first microwave signal in response to a change in the magnetic field.

22. The system of claim 15, wherein the processor is configured to determine the amplitude and/or direction of the magnetic field with a dynamic range of about 360 µT to about 100,000 µT.

23. The system of claim 15, wherein the first resonance represents a first energy-level transition.

24. The system of claim 23, wherein the first energy-level transition is a first hyperfine transition.

* * * * *